(12) United States Patent
Maruyama et al.

(10) Patent No.: US 7,579,758 B2
(45) Date of Patent: Aug. 25, 2009

(54) SUBSTRATE SUPPORTING VIBRATION STRUCTURE, INPUT DEVICE HAVING HAPTIC FUNCTION, AND ELECTRONIC DEVICE

(75) Inventors: Shigeaki Maruyama, Kanagawa (JP);
Tomoyuki Takahashi, Miyagi (JP);
Mikio Takenaka, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/938,669

(22) Filed: Nov. 12, 2007

(65) Prior Publication Data

US 2008/0122315 A1 May 29, 2008

(51) Int. Cl.
*H01L 41/053* (2006.01)
*H01L 41/113* (2006.01)

(52) U.S. Cl. ........................ 310/348; 310/338
(58) Field of Classification Search ............... 310/338, 310/339, 348
See application file for complete search history.

(56) References Cited

U.S. PATENT DOCUMENTS

| | | | | |
|---|---|---|---|---|
| 3,332,506 A | * | 7/1967 | Bradfield | 177/210 R |
| 4,158,117 A | * | 6/1979 | Quilliam et al. | 200/181 |
| 4,821,584 A | * | 4/1989 | Lembke | 73/862.68 |
| 5,349,263 A | * | 9/1994 | Katayama et al. | 310/338 |
| 6,003,390 A | * | 12/1999 | Cousy | 73/865.7 |
| 6,442,812 B1 | * | 9/2002 | Kovacich et al. | 29/25.35 |

FOREIGN PATENT DOCUMENTS

| | | |
|---|---|---|
| JP | 2004-94389 | 3/2004 |
| JP | P2006-309543 | 11/2006 |

* cited by examiner

*Primary Examiner*—Thomas M Dougherty
(74) *Attorney, Agent, or Firm*—K&L Gates LLP

(57) ABSTRACT

There is provided a substrate supporting vibration structure which is a vibration structure for supporting a substrate. The substrate supporting vibration structure includes a spacer member, fixed between a first substrate and a second substrate, having at least one form selected from a pillar form and a long strip form; and a piezoelectric element, formed at a predetermined position between the first substrate and the second substrate or at a predetermined position of the long strip-form portion of the spacer member, having a vibration supporting portion and a vibration applying portion. In the structure, the vibration supporting portion and vibration applying portion of the piezoelectric element are disposed in the thicknesswise direction of the first and second substrates stacked.

4 Claims, 18 Drawing Sheets

SUBSTRATE SUPPORTING VIBRATION STRUCTURE, INPUT DEVICE HAVING HAPTIC FUNCTION, AND ELECTRONIC DEVICE

CROSS REFERENCES TO RELATED APPLICATION

The present application claims priority to Japanese Patent Application JP 2006-309543 filed in the Japanese Patent Office on Nov. 15, 2006, the entire contents of which is being incorporated herein by reference.

BACKGROUND

The present application relates to a substrate supporting vibration structure, an input device having a haptic function, and an electronic device, which are advantageously applied to an information processing device, mobile phone, personal digital assistant, or the like which gives a haptic stimulus to an operating body when selecting an icon or the like on the display screen for input item selection and inputting information.

More particularly, the present application is to provide a vibration substrate having a piezoelectric element at a predetermined position of a spacer member, fixed between two substrates, having a pillar form and/or a long strip form, and a vibration supporting portion and a vibration applying portion of the piezoelectric element disposed in the substrate supporting direction. The vibration substrate has rigidity that reduces a dimensional change caused due to bending stresses or torsion stresses. In addition, when the piezoelectric element is vibrated, the vibration substrate can surely achieve high reliability with respect to the vibration transmission, irrespective of the position of the vibration substrate being used.

In recent years, users or operators have various kinds of content introduced into mobile terminal devices, such as mobile phones and personal digital assistants (PDAs), and utilize them. These mobile terminal devices individually have an input device. As the input device, generally, a keyboard, an input means such as a JOG dial, a touch panel having a display unit, or the like is used.

An input-output device combined with a piezoelectric actuator has also been developed. The piezoelectric actuator comprises two or more stacked layers of piezoelectric elements having different strain amounts or a piezoelectric element and a non-piezoelectric element which are stacked, and bending deformation of the stacked material caused due to the difference between the strain amounts when applying a vibration control voltage to the piezoelectric element in the stacked material is mechanically utilized (vibrator function). It has been known that, conversely, when force is applied to the piezoelectric element, the piezoelectric element generates a voltage (force detecting sensor function).

As the actuator, a so-called bimorph actuator, unimorph actuator, disk actuator (hereinafter, these are collectively referred to simply as "piezoelectric actuator"), or the like is frequently used. The piezoelectric actuator is classified into a piezoelectric actuator of a multilayer structure and a piezoelectric actuator of a single layer structure, and, generally, the piezoelectric actuator of a single layer structure has a driving voltage as high as 50 V or more, and is not suitable for electronic devices, especially mobile devices.

With respect to the electronic device having a piezoelectric actuator of this type, an input-output device and an electronic device are disclosed in Japanese Patent Application Publication (KOKAI) No. 2004-94389 (FIG. 4, page 9) (Patent Document 1). This electronic device has an input-output device having a bimorph-type piezoelectric actuator and a touch panel. The piezoelectric actuator is disposed between a display device and the touch panel, and gives different haptic stimuli to a user through the touch panel according to the type of vibration control data. The input-output device has a touch panel supporting structure in which the piezoelectric actuator is attached to a support frame.

FIG. 18 is a cross-sectional view showing a related art touch panel supporting vibrator 500. The touch panel supporting vibrator 500 shown in FIG. 18 is seen in the patent document 1, and display means 29 and a touch panel 24 are disposed on a body substrate 501. A part fitting space 102 is defined between the touch panel 24 and the display means 29. Piezoelectric actuators 125 are mounted in the part fitting space 102 respectively at the four corners of a non-display region around the display region of the display means 29. Under each piezoelectric actuator 125 are formed supporting portions 106 and 107 constituting vibration supporting points.

Thus the four piezoelectric actuators 125 are disposed in the respective four corners on the display means 29. An applying portion 108 constituting a vibration applying point is formed on the piezoelectric actuator 125 at the middle. The applying portion 108 is composed of a separate component, and attached onto the piezoelectric actuator at the middle and pressed against the touch panel 24.

The touch panel 24 is supported by the four applying portions 108, and a panel press frame 104 presses the perimeter of the upper portion of the touch panel 24 through a dust seal 105. The panel press frame 104 has at its top a bent portion having a reverse L-shaped cross-section. The panel press frame 104 is fixed to the body substrate 501 by, for example, a screw 109. A wiring 103 is connected to the piezoelectric actuator 125, and drawn through an opening portion formed in the panel press frame 104.

In the touch panel supporting vibrator 500, when a vibration control voltage is fed to the four piezoelectric actuators 125 through the wiring 103, vibration can be transmitted to the touch panel 24.

SUMMARY

By the way, when the structure of the touch panel supporting vibrator 500 disclosed in the patent document 1 is employed in an electronic device, such as a related art information processing device, mobile phone, or personal digital assistant (mobile device) having a haptic input function, the following problems occur.

i. When the touch panel supporting vibrator 500 held in a horizontal position is used, the touch panel 24 is supported by the four piezoelectric actuators 125. However, when the touch panel supporting vibrator 500 held in a vertical position or slanting position is used, the touch panel 24 is inevitably supported only by the bonding force of the supporting portions 106 and 107, the applying portion 108, or the like.

For this reason, there is a possibility that, when the touch panel 24 shifts from the display means 29 or the bonding force lacks, the piezoelectric actuator 125 removed from the touch panel 24 and display means 29 moves within the part fitting space 102.

ii. In addition, in the structure of the touch panel supporting vibrator 500 disclosed in the patent document 1, the two supporting portions 106, 107 constituting the supporting points of the piezoelectric actuator 125 are composed of separate parts, and these separate parts must be individually attached to the support frame, piezoelectric actuator 125, and others through a bonding member (adhesive material).

Further, it is required that the applying portion 108 constituting the applying point of the piezoelectric actuator 125 be attached at the middle top to the touch panel 24 through a bonding member. Thus a number of separate parts are needed, and further the bonding operations lower the workability in fitting the piezoelectric element, causing a problem of cumbersome fitting operation of the piezoelectric actuator 125.

iii. When the structure of the touch panel supporting vibrator 500 is employed in a mobile device or the like, the structure in which the touch panel 24 cannot be surely fixed to the body substrate 501 or the position of the touch panel 24 cannot be specified possibly makes it difficult to improve the reliability of an electronic device having a haptic input function. Especially in an electronic device to which vibration is always applied from the outside, such as a car device, the above problem is serious.

Accordingly, the present application provides in an embodiment a substrate supporting vibration structure which is advantageous not only in that the vibration substrate is rigid, but also in that, irrespective of the position of the vibration substrate being used, high reliability with respect to the vibration transmission can be surely achieved, and an input device and an electronic device having a haptic function.

The issue lying in the related art is solved by a substrate supporting vibration structure being a structure for supporting and vibrating a substrate, which includes a spacer member; and a piezoelectric element. The spacer member is fixed between a first substrate and a second substrate, and has at least one form selected from a pillar form and a long strip form. The piezoelectric element is formed at a predetermined position between the first substrate and the second substrate or at a predetermined position of the long strip-form portion of the spacer member, and has a vibration supporting portion and a vibration applying portion. In the substrate supporting vibration structure, vibration supporting portion and vibration applying portion of the piezoelectric element are disposed in the thicknesswise direction of the first and second substrates stacked.

In a substrate supporting vibration structure according to an embodiment, in a case of supporting and vibrating a substrate, a spacer member having at least one form selected from a pillar form and a long strip form is fixed between a first substrate and a second substrate. A piezoelectric element has a vibration supporting portion and a vibration applying portion, and is formed at a predetermined position between the first substrate and the second substrate or at a predetermined position of the long strip-form portion of the spacer member. The vibration supporting portion and vibration applying portion of the piezoelectric element are disposed in the thicknesswise direction of the first and second substrates stacked.

Thus, there can be provided a vibration housing having fixed the first substrate and the second substrate and having rigidity that reduces a dimensional change caused due to bending stresses or torsion stresses. Therefore, when the piezoelectric element is vibrated, irrespective of the position of the vibration housing being used, high reliability with respect to the vibration transmission can be surely achieved.

An input device having a haptic function according to an embodiment of the present invention is an input device having a haptic function for giving a haptic stimulus to an operating body during an information input operation. The input device includes: an input detector means; a display means formed under the input detector means; and a substrate supporting vibration structure for giving a haptic stimulus to the operating body in response to the input operation for the input detector means. The substrate supporting vibration structure is a vibration structure for supporting the input detector means, and includes: a spacer member; and a piezoelectric element. The spacer member is fixed between the input detector means and the display means, and has at least one form selected from a pillar form and a long strip form. The piezoelectric element is formed at a predetermined position between the input detector means and the display means or at a predetermined position of the long strip-form portion of the spacer member, and has a vibration supporting portion and a vibration applying portion. The vibration supporting portion and vibration applying portion of the piezoelectric element are disposed in the thicknesswise direction of the input detector means and display means stacked.

The input device having a haptic function according to the embodiment of the present invention includes the substrate supporting vibration structure of the present invention, and can give a haptic stimulus to an operating body in response to the input operation from the rigid vibration housing having fixed the input detector means and the display means.

Therefore, when the piezoelectric element is vibrated, irrespective of the position of the vibration housing being used, high reliability with respect to the vibration transmission can be surely achieved.

An electronic device according to an embodiment of the present invention is an electronic device having a haptic input function for giving a haptic stimulus to an operating body during an information input operation. The electronic device includes an input device having a haptic function. The input device has an input detector means; a display means formed under the input detector means; and a substrate supporting vibration structure for giving a haptic stimulus to the operating body in response to the input operation for the input detector means. The substrate supporting vibration structure is a vibration structure for supporting the input detector means, and includes: a spacer member; and a piezoelectric element. The spacer member is fixed between the input detector means and the display means, and has at least one form selected from a pillar form and a long strip form. The piezoelectric element is formed at a predetermined position between the input detector means and the display means or at a predetermined position of the long strip-form portion of the spacer member, and has a vibration supporting portion and a vibration applying portion. The vibration supporting portion and vibration applying portion of the piezoelectric element are disposed in the thicknesswise direction of the input detector means and display means stacked.

The electronic device of the present invention comprises the input device having a haptic function according to the embodiment of the present invention, and can give a haptic stimulus to an operating body in response to the input operation from the rigid vibration housing having fixed the first substrate and the second substrate.

Therefore, when the piezoelectric element is vibrated, irrespective of the position of the vibration housing being used, high reliability with respect to the vibration transmission can be surely achieved.

Additional features and advantages are described herein, and will be apparent from, the following Detailed Description and the figures.

DETAILED DESCRIPTION

A substrate supporting vibration structure and an input device and an electronic device having a haptic function according to embodiments will be described with reference to the accompanying drawings.

First Embodiment

Figure 1:
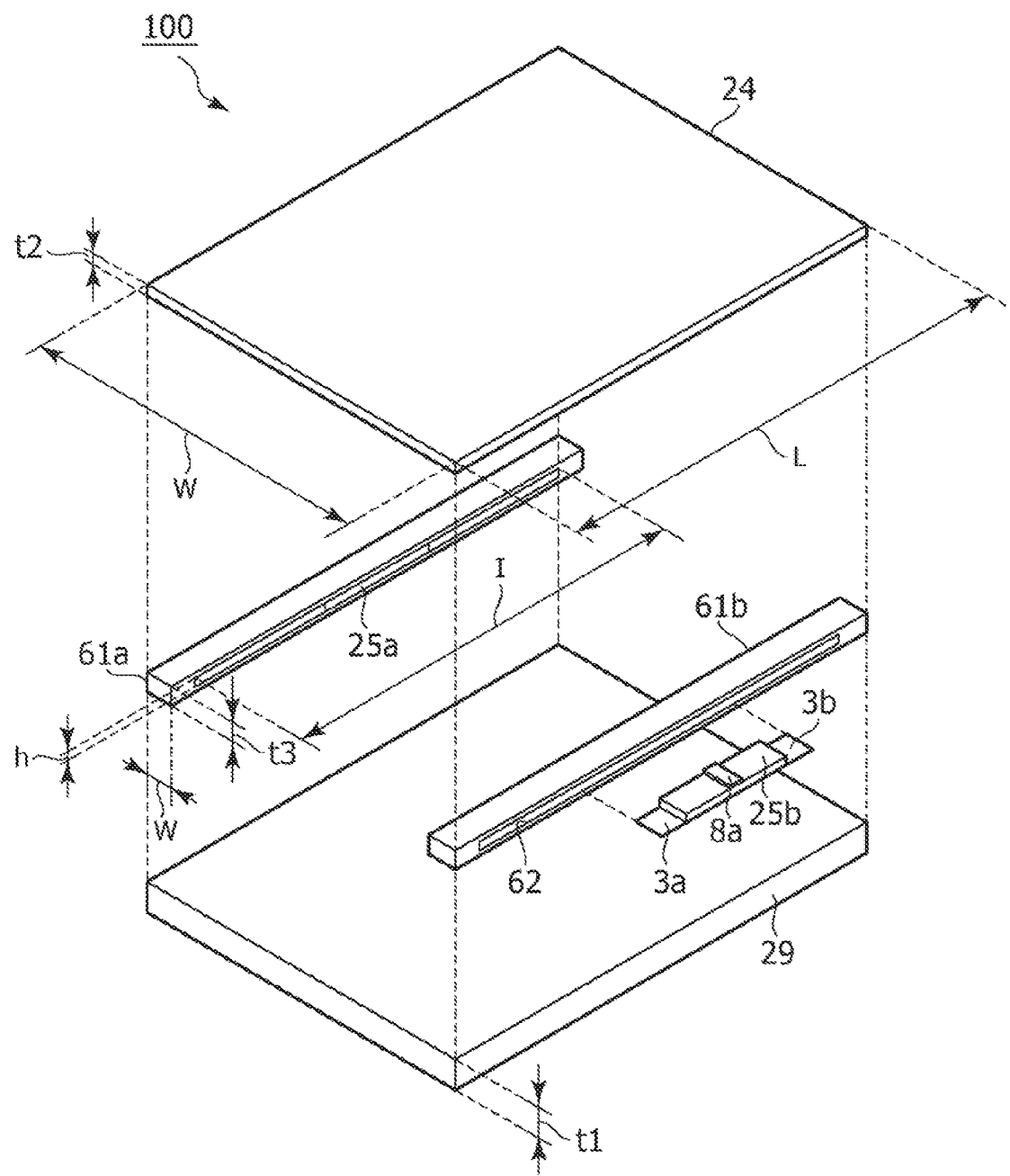
FIG. 1 is a perspective view showing an example of the structure of a touch panel supporting vibrator according to a first embodiment.

FIG. 1 is a perspective view showing an example of the structure of a touch panel supporting vibrator 100 according to a first embodiment.

The touch panel supporting vibrator 100 shown in FIG. 1 constitutes an example of the substrate supporting vibration structure, and is a structure for supporting and vibrating a substrate. Herein the touch panel supporting vibrator is a structure such that a plane-form input means, such as a touch panel, is not supported by an elastic material as seen in the prior art but rigidly fixed with a point or line. In this example, in the vibration substrate (body to be vibrated), a display means 29 as an example of a first substrate and a touch panel 24 as an example of a second substrate are used. As the display means 29, a liquid crystal display device is used. The second substrate may be a touch pad as a planar input device. The touch panel supporting vibrator 100 has a structure which can be fitted into a housing of mobile phone, personal digital assistant, or the like, and can give a haptic stimulus utilizing vibration caused by the piezoelectric element.

In this example, the touch panel 24 and display means 29 individually have a width of W (mm) and a length of L (mm), and respectively have predetermined thicknesses of t1 and t2 (mm). Rigid portions 61a, 61b having a long strip form as examples of the spacer member are fixed between the touch panel 24 and the display means 29. In this example, the rigid portion 61a has a width of w (mm) and a length of L (mm), and has a predetermined thickness of t3 (mm). In the figure, the rigid portion 61a is disposed on the left end of the display means 29, and the rigid portion 61b is disposed on the right end. One surface of the rigid portion 61a is bonded to the surface of the display means 29 at the left end, and another surface is bonded to the back surface of the touch panel 24 at the left end. One surface of the rigid portion 61b is bonded to the surface of the display means 29 at the right end, and another surface is bonded to the back surface of the touch panel 24 at the right end.

In each of the rigid portions 61a, 61b, a part fitting space (part fitting site) 62 as a hollow form is formed. Each of the rigid portions 61a, 61b has, for example, a rod form having a rectangular cross-section, and has formed therein the slit-form part fitting space 62. The part fitting space 62 has a length of l (mm), a width of w (mm), and a height of h (mm). In each of the rigid portions 61a, 61b, a material having a large modulus of elasticity, e.g., a large Young's modulus of elasticity, such as a synthetic resin member or a metal member composed of aluminum, iron, copper, or an alloy thereof, is used.

In each of the rigid portions 61a, 61b, a piezoelectric element is mounted on a predetermined position of the part fitting space 62. As the piezoelectric element, a bimorph-type piezoelectric actuator is used. For example, a piezoelectric actuator 25a is contained in and fixed to the part fitting space 62 of the rigid portion 61a, and a piezoelectric actuator 25b is contained in and fixed to the part fitting space 62 of the rigid portion 61b. The piezoelectric actuators 25a, 25b individually have a size such that the piezoelectric actuator can be contained in the part fitting space 62. The piezoelectric actuators 25a, 25b individually have center electrodes 3a, 3b constituting vibration supporting portions and a vibration applying portion 8a.

In this example, the center electrodes 3a, 3b and vibration applying portion 8a of the piezoelectric actuator 25a or the like are disposed in the thicknesswise direction of the stacked display means 29 and touch panel 24. For example, the center electrodes 3a, 3b are individually joined to the bottom of the part fitting space 62, and the vibration applying portion 8a is joined to the top of the part fitting space 62. As an example of the order of the stacked display means 29 and touch panel 24, there can be mentioned a case where the display means 29 constitutes the lower layer and the touch panel 24 constitutes the upper layer. The position of the touch panel supporting vibrator 100 upon being used includes a position in which the display means 29 is on the lower side and the touch panel 24 is on the upper side, and a position in which the display means 29 is on the upper side and the touch panel 24 is on the lower side.

Figure 2:
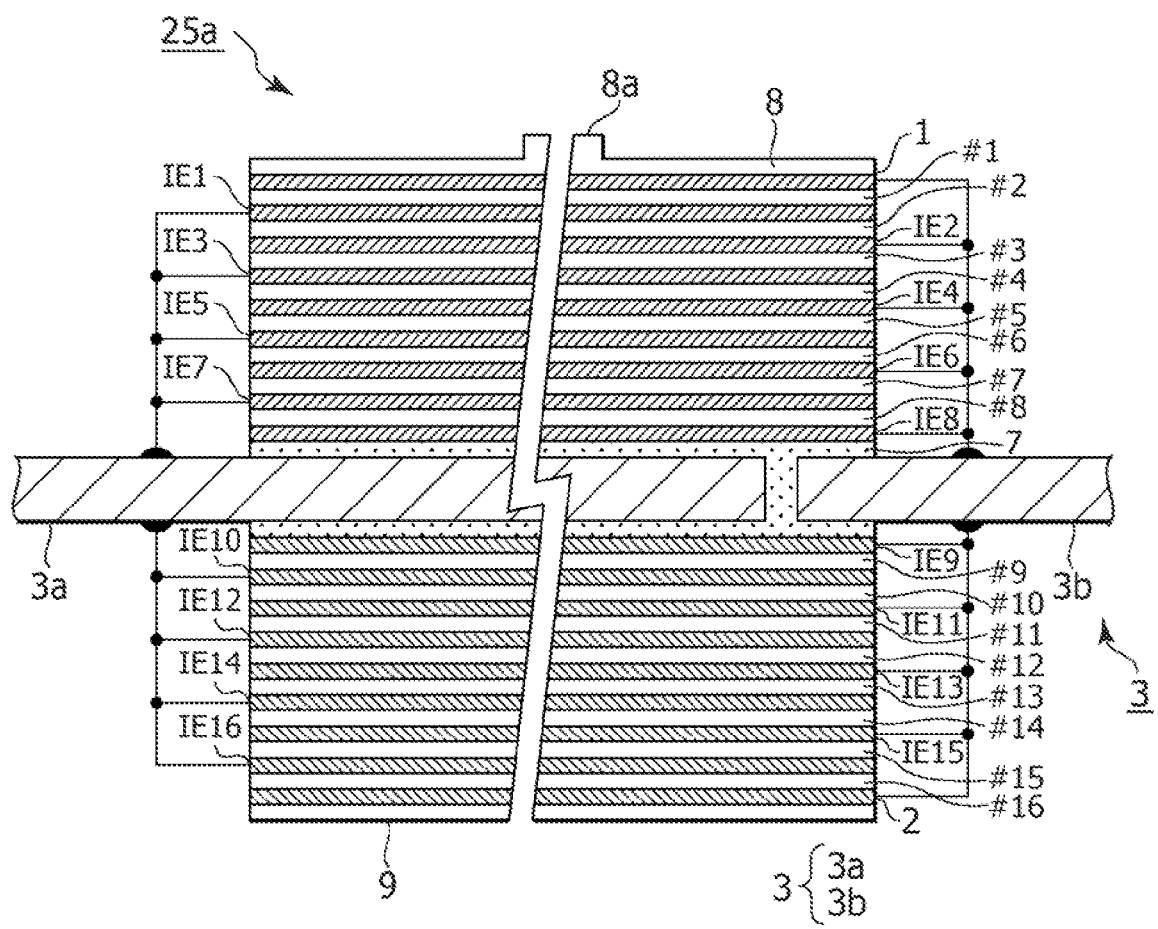
FIG. 2 is an enlarged cross-sectional view showing an example of a film-form piezoelectric laminate as a piezoelectric actuator.
Figure 3A:
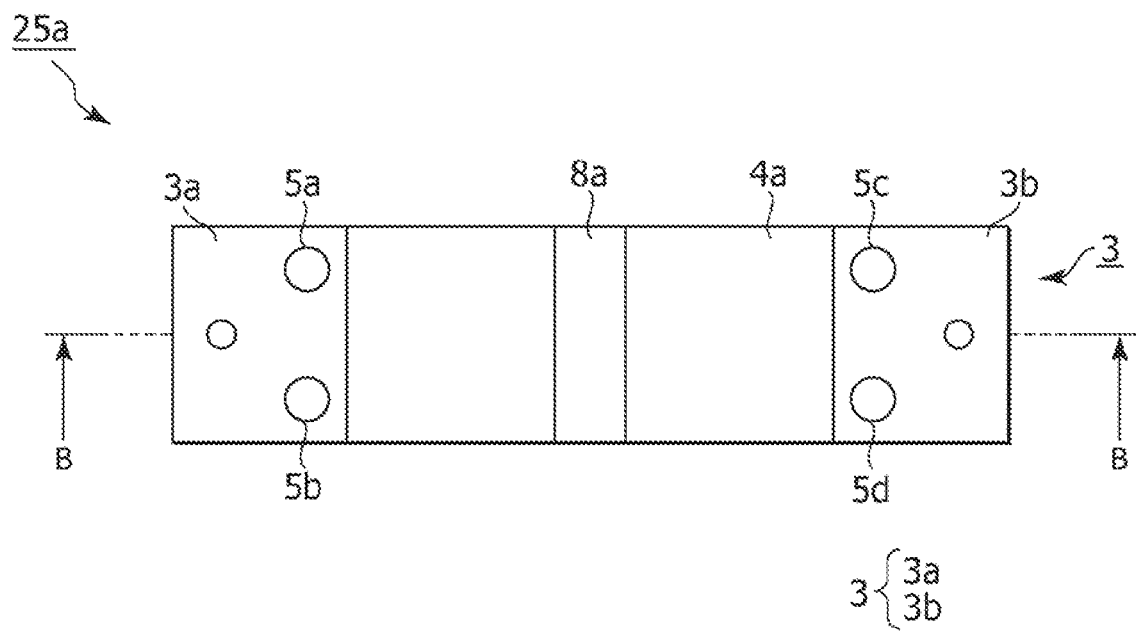
FIG. 3A is a plan view showing an example of the construction of the piezoelectric actuator.
Figure 3B:
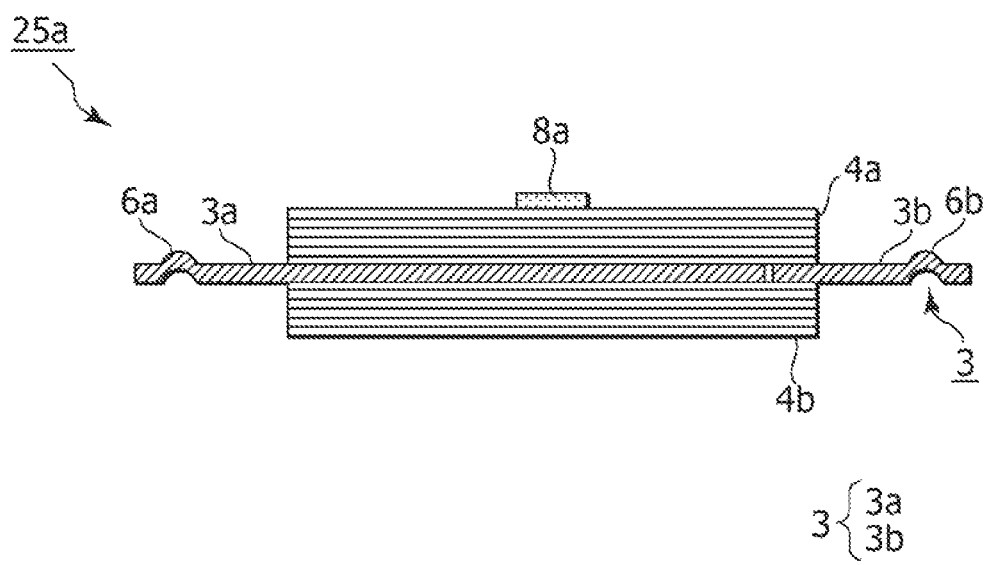
FIG. 3B is a cross-sectional view of FIG. 3A, taken along the line B-B.

FIG. 2 is an enlarged cross-sectional view showing an example of a film-form piezoelectric laminate as the piezoelectric actuator 25a. FIG. 3A is a plan view showing an example of the construction of the piezoelectric actuator 25a, and FIG. 3B is a cross-sectional view of FIG. 3A, taken along the line B-B. The piezoelectric actuator 25b has the same construction as that of the piezoelectric actuator 25a, and therefore a description of the piezoelectric actuator 25b is omitted.

The piezoelectric actuator 25a having a multilayer structure shown in FIG. 2 has a substrate (hereinafter, referred to as "shim 3"), and includes a film-form piezoelectric laminate #1 to #8 composed of 8 layers joined to the surface of the substrate 3 through a bonding agent 7, and a film-form piezoelectric laminate #9 to #16 composed of 8 layers joined to the back surface through the bonding agent 7. The shim 3 constitutes the center electrodes 3a, 3b, and the center electrode 3a constitutes one vibration supporting portion and the center electrode 3b constitutes another vibration supporting portion. As the shim 3, a copper plate, a phosphor bronze plate, a cupronickel plate, or a brass plate is used. As the bonding agent 7, an epoxy resin or an UV bonding agent is used.

The piezoelectric actuator (laminate) 25a has, for example, a form of a film-form piezoelectric laminate stacked between one electrode and another electrode, and includes the film-form piezoelectric laminate #1 to #16 composed of 16 layers in total, an upper electrode 1, a lower electrode 2, the positive and negative center electrodes 3a, 3b, and electrodes IE1 to IE16 composed of 16 layers.

In the film-form piezoelectric laminate #1 to #8 on the surface side, the upper electrode 1 is connected to the main electrodes IE2, IE4, IE6, and IE8 through a not shown through hole and connected to the center electrode 3b. The electrodes of the individual layers are connected by an electrode material filling the through hole. In the film-form piezoelectric laminate #9 to #16 on the back surface side, similarly, the lower electrode 2 is connected to the main electrodes IE9, IE11, IE13, and IE15 through a not shown through hole and connected to the center electrode 3b.

In the film-form piezoelectric laminate #1 to #8 on the surface side, the main electrode IE1 is connected to the main electrodes IE3, IE5, and IE7 through a not shown through hole and connected to the center electrode 3a. In the film-form piezoelectric laminate #9 to #16 on the back surface side, the main electrode IE10 is connected to the main electrodes IE12, IE14, and IE16 through a not shown through hole and connected to the center electrode 3a. Thus the 16 layers of the film-form piezoelectric laminate #1 to #16 are driven in parallel.

An upper insulating film 8 is formed so that it covers the upper electrode 1. The vibration applying portion 8a is formed at the middle of the upper electrode 1, and unified with the upper insulating film 8 and formed from the same insulating member as that for the upper insulating film 8. The vibration applying portion 8a is formed from the cured insulating member as the uppermost layer of the piezoelectric actuator 25a and unified with the upper insulating film 8. The vibration applying portion 8a can be formed either as the uppermost layer of the piezoelectric actuator 25a or on the lower portion in the part fitting site. In the latter case, a similar vibration effect can be obtained.

Thus the piezoelectric actuator 25a having an elastic function is formed. The piezoelectric actuator 25b is formed similarly. The piezoelectric actuators 25a, 25b are subjected to polarization treatment if necessary. The above-described construction of the piezoelectric actuator (laminate) 25a having an advantage in that it can be driven at a low voltage enables application to mobile devices.

In the piezoelectric actuator 25a shown in FIG. 3A, the shim 3 extends on the both sides of the film-form piezoelectric laminate #1 to #16, and portions (convex portions) on the both sides of the shim have elasticity. The elasticity of the convex portions of the shim 3 is utilized to cause the piezoelectric element itself to vibrate in the vertical direction. For obtaining a spring structure, the convex portion is processed into a structure that relaxes the rigidity of the shim 3.

For example, the convex portions of the substrate are subjected to perforating processing, cutout processing, bending processing, or the like so that they have elasticity. In this example, in the piezoelectric actuator 25a shown in FIG. 3B, a bent protrusion portion 6a and opening portions 5a, 5b shown in FIG. 3A are formed in the center electrode 3a constituting the vibration supporting portion, and similarly, a protrusion portion 6b and opening portions 5c, 5d are formed in the center electrode 3b, thus obtaining a large amount of elasticity. The elastic structures on the both sides of the shim 3 are utilized to cause the piezoelectric element itself to vibrate in the vertical direction.

In this example, the shim 3 extending on the both sides of the film-form piezoelectric laminate #1 to #16 constitutes the center electrodes 3a, 3b of the piezoelectric actuators 25a, 25b. Such a construction is made for feeding a vibration control voltage to the piezoelectric actuators 25a, 25b through the center electrodes 3a, 3b constituting the vibration supporting portions. The piezoelectric actuators 25a, 25b vibrate in accordance with the vibration control voltage.

In the bimorph-type piezoelectric actuator 25a and others, the piezoelectric element itself is bent utilizing a difference in deformation between the upper and lower layers constituting the piezoelectric element, i.e., the film-form piezoelectric laminate #1 to #8 and the film-form piezoelectric laminate #9 to #16, generally utilizing a property of the two layers such that one layer expands and another shrinks when applying a voltage.

The touch panel supporting vibrator 100 has a structure such that linear vibration displacement is obtained by propagating the above-mentioned bending deformation to the touch panel 24 which is a portion to be driven through the two center electrodes 3a, 3b constituting the vibration supporting portions formed on the surface and back surface of the piezoelectric actuator 25a or the like, for example, formed on the left and right ends of the shim 3, and through the one vibration applying portion 8a formed at the middle of the film-form piezoelectric laminate #1 to #16.

Specifically, the separate center electrodes 3a, 3b constituting the vibration supporting portions and the vibration applying portion 8a are needed to obtain linear displacement. In this example, the separate center electrodes 3a, 3b and vibration applying portion 8a and further the supporting structure of the touch panel 24 are formed in the rigid portions 61a, 61b as the same parts. The above-mentioned vibration propagates to an input means, such as the touch panel 24, fitted onto the rigid portions 61a, 61b, making it possible to give a touch to a finger of an operator or the like in contact with the touch panel 24.

Figure 4A:
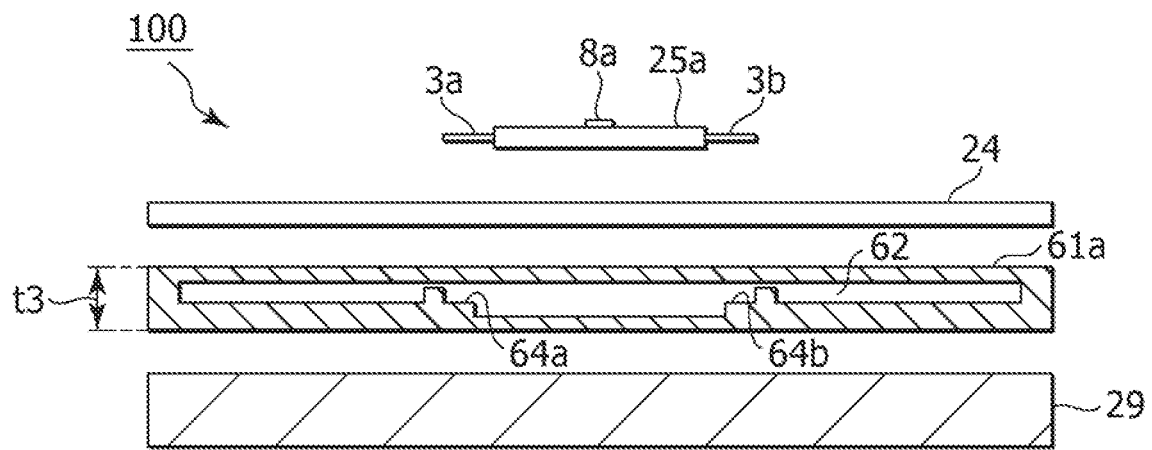
FIGS. 4A to 4C are views showing an example of the fabrication process for the touch panel supporting vibrator.
Figure 4B:
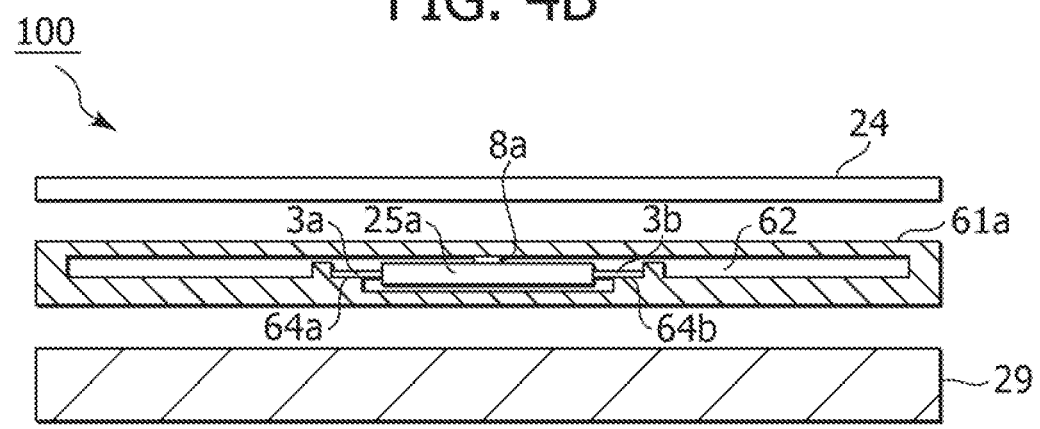
Figure 4C:
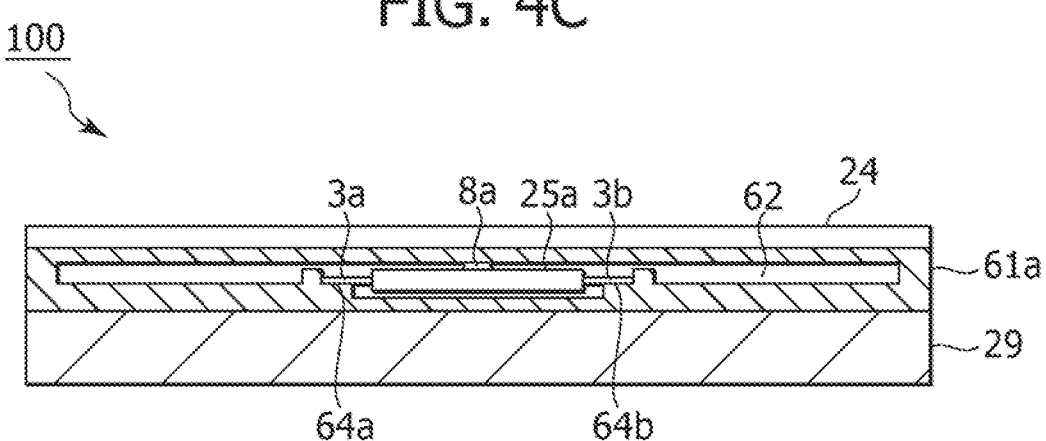

Next, the fabrication of the touch panel supporting vibrator 100 according to the first embodiment is described. FIGS. 4A to 4C are views showing an example of the fabrication process for the touch panel supporting vibrator 100.

In the present embodiment, the touch panel supporting vibrator 100 which can be applied to, e.g., an input means or display means for use in mobile phones, personal digital assistants, or the like is formed. In this example, the touch panel supporting vibrator 100 has the rigid portions 61a, 61b, and the piezoelectric actuator 25a is fitted to the rigid portion 61a and the piezoelectric actuator 25b is fitted to the rigid portion 61b. It is preferred that each of the touch panel 24 and the display means 29 has a flat bonding surface.

Under the above conditions for fabrication, the piezoelectric actuators 25a, 25b, touch panel 24, rigid portions 61a, 61b, and display means 29 shown in FIG. 4A are first prepared. The method of forming the piezoelectric actuator 25a and others is described above with reference to FIGS. 2 and 3, and the descriptions are omitted. An example of the fabrication of the rigid portions 61a, 61b and others is described below.

The rigid portions 61a, 61b having a part fitting site and having a thickness t3 (mm) are individually formed by, for example, making a predetermined mold including therein a core for forming the slit-form part fitting space 62 and subjecting a synthetic resin to injection molding using the mold. The size of the part fitting space 62 is determined by designing a mold having a length of l (mm), a width of w (mm), and a height of h (mm). Protruding portions for die-cutting the slit of the part fitting space 62 are formed on the both surfaces of the mold. A predetermined resin material, for example, polycarbonate is placed in the mold and molded to form rigid portions 61a, 61b as support parts made of a rigid plastic.

In this example, the inside of the part fitting space 62 is processed for forming receiving electrodes 64a, 64b. For example, an electrode holder form having a step is formed to prevent the center electrodes 3a, 3b from shifting after the piezoelectric actuator 25a and others are mounted. By virtue of the electrode holder form, vibration can propagate to the touch panel surface, irrespective of the position of the touch panel supporting vibrator 100, for example, in the operation when the touch panel supporting vibrator 100 is held in a horizontal position, supine position, slanting position, or upright position.

An electrode insert hole is formed in the receiving electrodes 64a, 64b so that they are exposed through, for example, the upper surface of the part fitting space 62. One of the receiving electrodes 64a, 64b is, for example, a center electrode contact surface, and another is a lead connection terminal. In this example, the receiving electrodes 64a, 64b are engaged in the electrode insert hole and the lead connection terminal is drawn to the outside or lower portion of the frame.

When fitting a piezoelectric laminate part, the center electrodes 3a, 3b of the piezoelectric actuator 25a are connected to the receiving electrodes 64a, 64b. In the rigid portions 61a, 61b, either an injection molded article or an article formed by bending or cutting a metal member made of aluminum, iron, copper, or an alloy thereof may be used. When a metal member is used in the rigid portions 61a, 61b, the peripheries of the receiving electrodes 64a, 64b are insulated, excluding the charging unit.

Next, the piezoelectric actuator 25a is mounted on the rigid portion 61a shown in FIG. 4B. The not shown piezoelectric actuator 25b is also mounted on the rigid portion 61b. In this example, the receiving electrodes 64a, 64b are formed inside the part fitting space 62 of the rigid portion 61a, and the center electrodes 3a, 3b of the piezoelectric actuator 25a and the like are connected to the receiving electrodes 64a, 64b. The reason why this structure is employed resides in that electrical connection between the receiving electrodes 64a, 64b and the center electrodes 3a, 3b and mechanical engagement between the rigid portions 61a, 61b and the piezoelectric actuator 25a are achieved simultaneously and easily.

Then, the rigid portions 61a, 61b are sandwiched and fixed between the touch panel 24 and the display means 29 shown in FIG. 4C. In this example, the rigid portion 61a is disposed on the left end of the display means 29, and the rigid portion 61b is disposed on the right end. One surface of the rigid portion 61a is bonded to the surface of the display means 29 at the left end through a bonding agent, and another surface is bonded to the back surface of the touch panel 24 at the left end through a bonding agent. Similarly, one surface of the rigid portion 61b is bonded to the surface of the display means 29 at the right end through a bonding agent, and another surface is bonded to the back surface of the touch panel 24 at the right-hand end through a bonding agent. Thus, there can be formed the touch panel supporting vibrator 100 which can be mounted on a mobile phone or the like.

In the touch panel supporting vibrator 100 according to the first embodiment, in the touch panel 24 and the display means 29 which are stacked on one another and which support each other, the structure supporting the touch panel 24 is not a structure such that an elastic material is used for giving freedom of the haptic vibration to the touch panel 24 but a structure such that the both sides on the display means 29 are rigidly fixed with line to the bottom of the touch panel 24. The piezoelectric actuator 25a is formed in the part fitting space 62 of the rigid portions 61a, 61b between the touch panel 24 and the display means 29. In the above example, the center electrodes 3a, 3b constituting the vibration supporting portions of the piezoelectric actuator 25a or the like and the vibration applying portion 8a are mounted on not a separate part but the rigid portions 61a, 61b as the same parts. In addition, the center electrodes 3a, 3b and vibration applying portion 8a of the piezoelectric actuator 25 are disposed in the thicknesswise direction of the stacked display means 29 and touch panel 24.

Therefore, by using simple space parts, such as the rigid portions 61a, 61b, or a simple space joint method, there is achieved a structure supporting the center electrodes 3a, 3b and vibration applying portion 8a of the piezoelectric actuator 25 and the touch panel 24 as a plane-form input device. Thus, there can be provided a vibration housing having fixed the display means 29 and the touch panel 24 and having rigidity that reduces a dimensional change caused due to bending stresses or torsion stresses. Therefore, when the piezoelectric actuator 25a or the like is vibrated, irrespective of the position of the vibration housing being used, high reliability with respect to the vibration transmission can be surely achieved.

The vibration generated by the piezoelectric actuator 25 in the substrate supporting vibration structure can be applied particularly to an electronic device to which external force of vibration, impact, or the like is highly possibly exerted, such as a mobile device or a car device.

With respect to the fabrication process for the touch panel supporting vibrator 100, the order of the steps for fabrication is not limited to the order described above, and the process may be performed in the following order: the piezoelectric actuator 25a is first mounted on the rigid portions 61a, 61b, and then the rigid portions 61a, 61b having the piezoelectric actuator are sandwiched and fixed between the touch panel 24 and the display means 29. When, for example, a double-sided adhesive tape is attached to the upper and lower surfaces of each of the rigid portions 61a, 61b, the bonding step is simplified and the number of the fabrication steps is advantageously further reduced.

Second Embodiment

Figure 5:
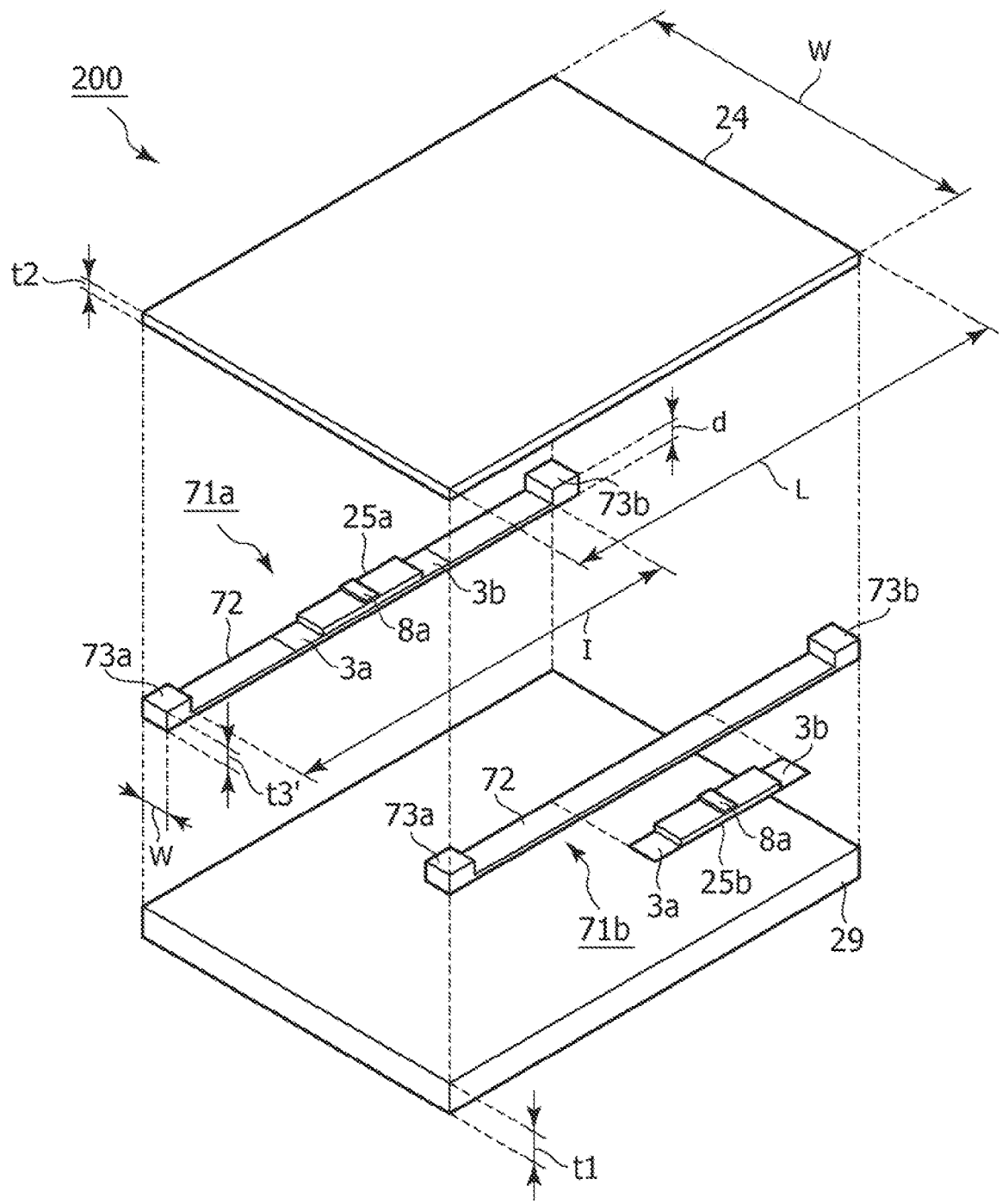
FIG. 5 is a perspective view showing an example of the structure of a touch panel supporting vibrator according to a second embodiment.

FIG. 5 is a perspective view showing an example of the structure of a touch panel supporting vibrator 200 according to a second embodiment.

The touch panel supporting vibrator 200 shown in FIG. 5 has rigid portions 71a, 71b having a long strip form. In each of the rigid portions 71a, 71b, a part fitting space 72 having a top open form is formed, and center electrodes 3a, 3b constituting the vibration supporting portions of a piezoelectric actuator 25a are joined to the rigid portions 71a, 71b or the like as the same parts, and a vibration applying portion 8a is joined to (pressed against) a touch panel 24 as a separate part. The vibration applying portion 8a is directly joined to, for example, the back surface of the touch panel 24 through a bonding agent. For obtaining rigidity, it is desired that the back surface of the touch panel 24 is composed of a rigid resin.

In this example, the touch panel 24 and display means 29 individually have a width of W (mm) and a length of L (mm), and respectively have predetermined thicknesses of t1 and t2 (mm). The rigid portions 71a, 71b having a top open form as another example of the spacer member are fixed between the touch panel 24 and the display means 29. In this example, the rigid portion 71a has a width of w (mm) and a length of L (mm), and has a predetermined thickness of t3' (mm). With respect to the thickness of the rigid portions 71a, 71b, in connection with the first embodiment, t3>t3' is satisfied.

In the figure, the rigid portion 71a is disposed on the left end of the display means 29, and the rigid portion 71b is disposed on the right end. The bottom surface of the rigid portion 71a is bonded to the surface of the display means 29 at the left end, and protrusion (pillar) portions 73a, 73b at the both ends of the rigid portion 71a are bonded to the back surface of the touch panel 24 at the left end. The bottom surface of the rigid portion 71b is bonded to the surface of the display means 29 at the right end, and protrusion (pillar) portions 73a, 73b at the both ends of the rigid portion 71b are bonded to the back surface of the touch panel 24 at the right end.

In each of the rigid portions 71a, 71b, a part fitting site 72 having a top open form is formed. Each of the rigid portions 71a, 71b has, for example, a long-strip concave form, and has formed therein the part fitting space 72. The part fitting space 72 has a concave form having a length of l (mm), a width of w (mm), and a depth of d (mm). In each of the rigid portions 71a, 71b, like the rigid portions 61a, 61b, a material having a large modulus of elasticity, e.g., a large Young's modulus of elasticity, such as a synthetic resin member or a metal member made of aluminum, iron, copper, or an alloy thereof, is used.

Figure 6A:
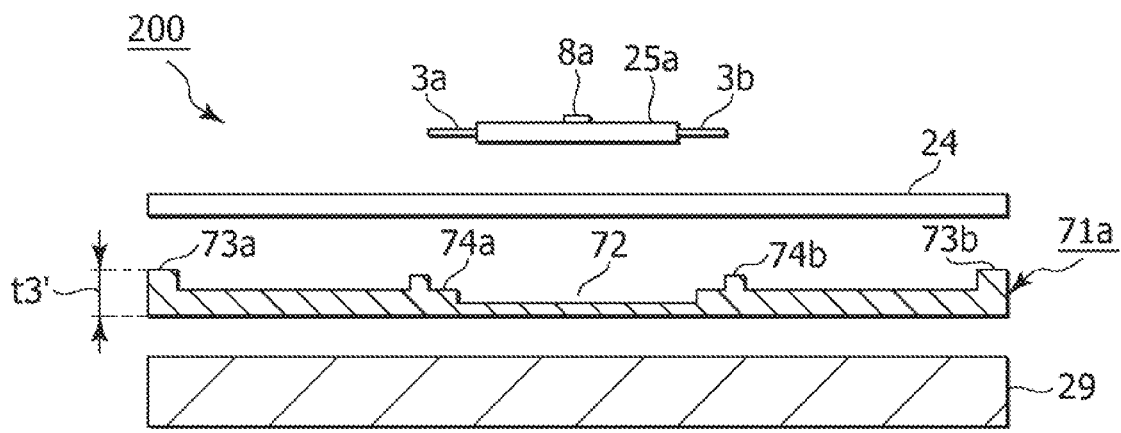
FIGS. 6A to 6C are views showing an example of the fabrication process for the touch panel supporting vibrator.
Figure 6B:
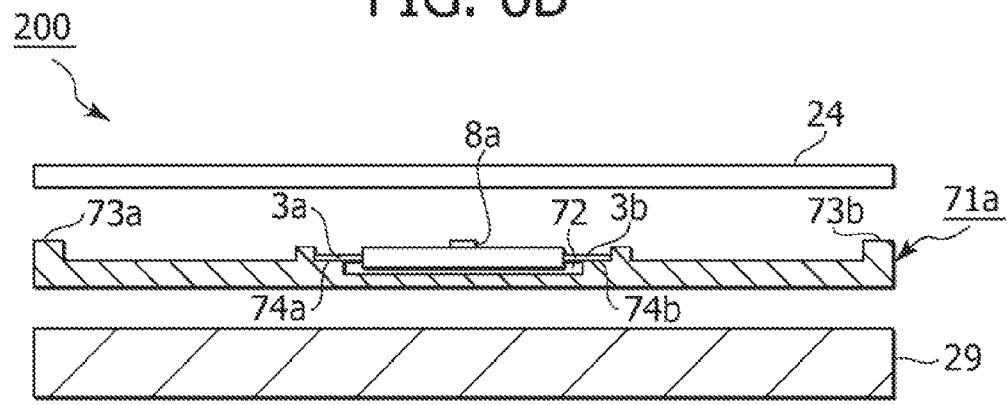
Figure 6C:
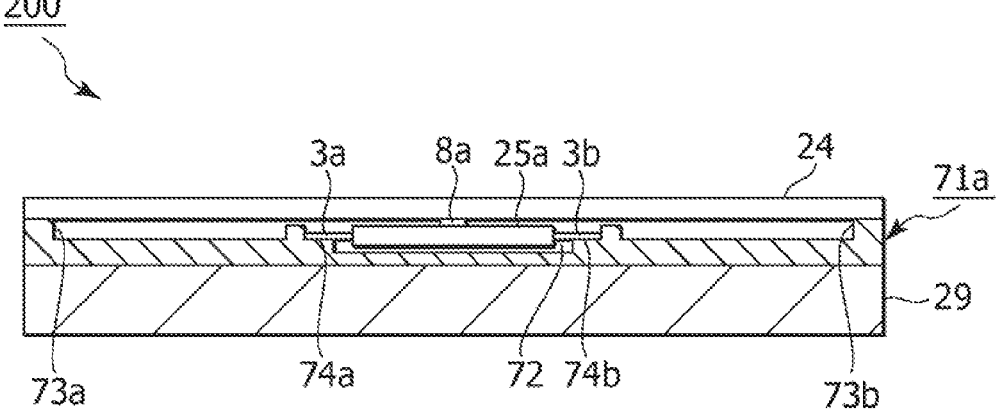

Next, the fabrication of the touch panel supporting vibrator 200 according to the second embodiment is described. FIGS. 6A to 6C are views showing an example of the fabrication process for the touch panel supporting vibrator 200.

In the present embodiment, the touch panel supporting vibrator 200 which can be applied to, e.g., an input means or display means for use in mobile phones, personal digital assistants, or the like is formed. In this example, the touch panel supporting vibrator 200 has the rigid portions 71a, 71b, and, like the first embodiment, the piezoelectric actuators 25a, 25b are respectively fitted to the rigid portions 71a, 71b. It is preferred that each of the touch panel 24 and the display means 29 has a flat joint surface.

Under the above conditions for fabrication, the piezoelectric actuators 25a, 25b, touch panel 24, rigid portions 71a, 71b, and display means 29 shown in FIG. 6A are first prepared. The method of forming the piezoelectric actuator 25a and others is described above with reference to FIGS. 2 and 3, and the descriptions are omitted. An example of the fabrication of the rigid portions 71a, 71b and others is described below.

The rigid portions 71a, 71b having a part fitting space and having a thickness of t3' (mm) are individually formed by, for example, making a predetermined mold including therein a core having a form of the concave-form part fitting space 72 and subjecting a synthetic resin material to injection molding using the mold. The size of the part fitting space 72 is determined by designing a mold having a length of l (mm), a width of w (mm), and a depth of d (mm). Protruding portions for die-cutting the part fitting space 72 are formed on the both surfaces of the mold. A predetermined synthetic resin material, for example, polycarbonate is placed in the mold and molded to form rigid portions 71a, 71b made of a rigid plastic.

In this example, the inside of the part fitting space 72 is processed for forming receiving electrodes 74a, 74b. For example, like the first embodiment, an electrode holder form having a step is formed to prevent the center electrodes 3a, 3b from shifting after the piezoelectric actuator 25a and others are mounted. By virtue of the electrode holder form, vibration can propagate to the touch panel surface, irrespective of the position of the touch panel supporting vibrator 200, for example, in the touch operation when the touch panel supporting vibrator 200 is held in a horizontal position, supine position, slanting position, or upright position. The receiving electrodes 74a, 74b are similar to those in the first embodiment, and the descriptions of them are omitted.

When fitting a piezoelectric laminate part, the center electrodes 3a, 3b of the piezoelectric actuator 25a are connected to the receiving electrodes 74a, 74b. In the rigid portions 71a, 71b, either an injection molded article or an article formed by bending or cutting a metal member made of aluminum, iron, copper, or an alloy thereof may be used. When a metal member is used in the rigid portions 71a, 71b, like the first embodiment, the receiving electrodes 74a, 74b are insulated, excluding the charging unit.

Next, the piezoelectric actuator 25a is mounted on the rigid portion 71a shown in FIG. 6B. The not shown piezoelectric actuator 25b is also mounted on the rigid portion 71b. In this example, the receiving electrodes 74a, 74b are formed inside the part fitting space 72 of the rigid portion 71a, and the center electrodes 3a, 3b of the piezoelectric actuator 25a and the like are connected to the receiving electrodes 74a, 74b. The reason why this structure is employed is the same as the reason in the first embodiment.

Then, the rigid portions 71a, 71b are sandwiched and fixed between the touch panel 24 and the display means 29 shown in FIG. 6C. In this example, the rigid portion 71a is disposed on the left end of the display means 29, and the rigid portion 71b is disposed on the right end. One surface of the rigid portion 71a is bonded to the surface of the display means 29 at the left end through a bonding agent, and the protrusion portions 74a, 74b at the both ends of the rigid portion 71a are bonded to the back surface of the touch panel 24 at the left end through a bonding agent.

Similarly, one surface of the rigid portion 71b is bonded to the surface of the display means 29 at the right end, and the protrusion portions 74a, 74b at the both ends of the rigid portion 71b are bonded to the back surface of the touch panel 24 at the right end through a bonding agent. Thus, the vibration applying portion 8a of the piezoelectric actuator 25a is pressed against the bottom surface of the touch panel 24 on the rigid portion 71a, and the vibration applying portion 8a of the piezoelectric actuator 25b is pressed against the bottom surface of the touch panel 24 on the rigid portion 71b. There can be formed the touch panel supporting vibrator 200 which can be mounted on a mobile phone or the like.

With respect to the fabrication process for the touch panel supporting vibrator 200, the order of the steps for fabrication is not limited to the order described above, and the process may be performed in the following order: the piezoelectric actuators 25a, 25b are first mounted on the rigid portions 71a, 71b, and then the rigid portions 71a, 71b having the piezoelectric actuators are sandwiched and fixed between the touch panel 24 and the display means 29.

In the touch panel supporting vibrator 200 according to the second embodiment, in the touch panel 24 and the display means 29 which are stacked on one another and which support each other, the structure supporting the touch panel 24 is not a structure such that an elastic material is used for giving freedom of the haptic vibration to the touch panel 24 but a structure such that the supporting points on the display means 29 at the four corners, i.e., the protrusion portions 74a, 74b on one side and the protrusion portions 74a, 74b on the other side are rigidly fixed to the bottom of the touch panel 24.

The piezoelectric actuators 25a, 25b are individually formed in the part fitting space 72 of the rigid portions 71a, 71b between the touch panel 24 and the display means 29. In the above example, the center electrodes 3a, 3b of the piezoelectric actuator 25a or the like are mounted on not a separate part but the rigid portions 71a, 71b as the same parts, and the vibration applying portion 8a is directly joined to (abut against) the bottom of the touch panel 24. In addition, the center electrodes 3a, 3b and vibration applying portion 8a of the piezoelectric actuator 25 are disposed in the thickness-wise direction of the stacked display means 29 and touch panel 24.

Therefore, by using simple space parts, such as the rigid portions 71a, 71b, or a simple space joint method, there is achieved a structure supporting the center electrodes 3a, 3b and vibration applying portion 8a of the piezoelectric actuator 25a and the like and the touch panel 24 as a planar input device. Thus, there can be provided a rigid vibration housing having fixed the display means 29 and the touch panel 24. In addition, the thickness of the touch panel supporting vibrator can be reduced, as compared to that in the first embodiment, and, like the first embodiment, when the piezoelectric actuator 25a or the like is vibrated, irrespective of the position of the vibration housing being used, high reliability with respect to the vibration transmission can be surely achieved.

Third Embodiment

Figure 7:
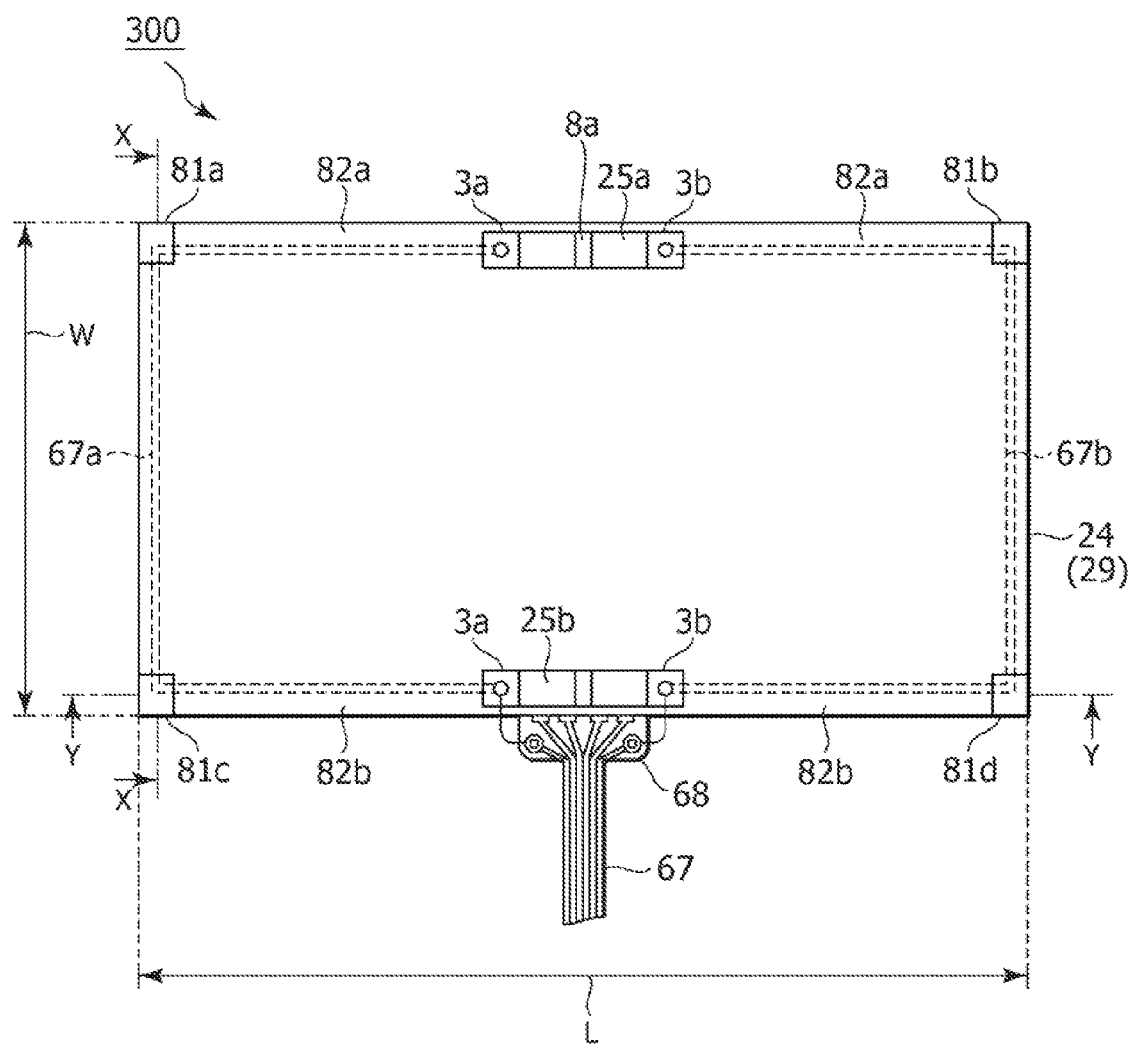
FIG. 7 is a top view showing an example of the structure (No. 1) of a touch panel supporting vibrator according to a third embodiment.
Figure 8A:
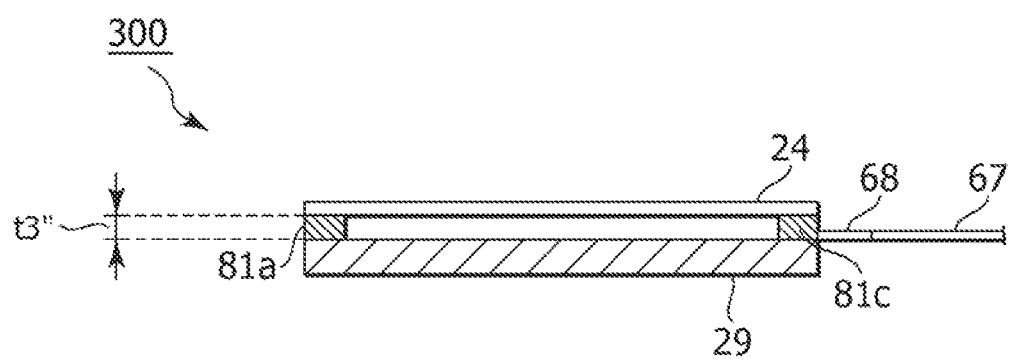
FIGS. 8A and 8B are views showing an example of the structure (No. 2) of the touch panel supporting vibrator.
Figure 8B:
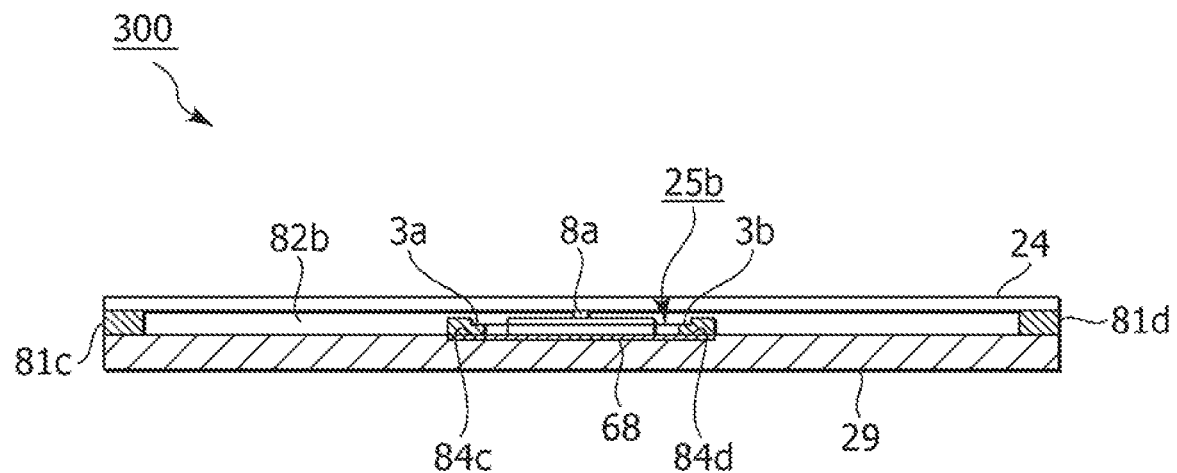

FIG. 7 is a top view showing an example of the structure (No. 1) of a touch panel supporting vibrator 300 according to a third embodiment. FIGS. 8A and 8B are views showing an example of the structure (No. 2), wherein FIG. 8A is a cross-sectional view of FIG. 7, taken along the line X-X, and FIG. 8B is a cross-sectional view of FIG. 7, taken along the line Y-Y.

The touch panel supporting vibrator 300 shown in FIG. 7 has a width of W (mm) and a length of L (mm). A touch panel 24 and a display means 29 are rigidly fixed with pillar portions 81a, 81b, 81c, 81d (four corner portions) at the four corners. Part fitting spaces 82a, 82b are respectively defined between the pillar portion 81a and the pillar portion 81b and between the pillar portion 81c and the pillar portion 81d.

A piezoelectric actuator 25a is disposed in the part fitting space 82a, and a piezoelectric actuator 25b is disposed in the part fitting space 82b. Also in this example, the piezoelectric actuator 25a has a long strip form, and has center electrodes 3a, 3b on the respective sides of the long strip-form portion and one vibration applying portion 8a at the middle of the long strip-form portion.

A printed board 68 is formed in the part fitting space 82b, and a wiring 67 in a sheet form is connected to the printed board from the outside. The wiring 67 is divided on the printed board 68, and one wiring is fed to apply a control driving voltage to the piezoelectric actuator 25b. The remaining wiring patterns 67a, 67b are connected to the piezoelectric actuator 25a on the other side, and similarly fed to apply a control driving voltage. The printed board 68 is preferably used also for the substrate of the touch panel 24 or the display means 29.

The pillar portion 81c in the touch panel supporting vibrator 300 shown in FIG. 8A and the pillar portion 81d constitute an example of the spacer member, and have a thickness of t3" (t3"<t3'<t3). The thickness t3" is substantially equivalent to the thickness of the piezoelectric actuator 25a or the like. The reason why the thickness t3" is set resides in that the touch panel supporting vibrator 300 is reduced in thickness, as compared to that in the first and second embodiments.

In the piezoelectric actuator 25a shown in FIG. 8B, the vibration applying portion 8a is disposed so that it faces the touch panel 24, and the center electrodes 3a, 3b constituting the vibration supporting portions are disposed so that they face the display means 29. The vibration applying portion 8a is abutted against the bottom surface of the touch panel 24, so that the vibration propagates in the direction pushing up the touch panel 24.

In this example, receiving electrodes 84c, 84d are formed on the printed board 68, and, in order to prevent the center electrodes 3a, 3b from shifting after the piezoelectric actuator 25b is mounted, the receiving electrode 84c and the center electrode 3a are soldered together, and similarly, the receiving electrode 84d and the center electrode 3b are soldered together. By virtue of employing this electrode structure, vibration can propagate to the touch panel surface, irrespective of the position of the touch panel supporting vibrator 300, for example, in the operation when the touch panel supporting vibrator 300 is held in a horizontal position, supine position, slanting position, or upright position.

Figure 9A:
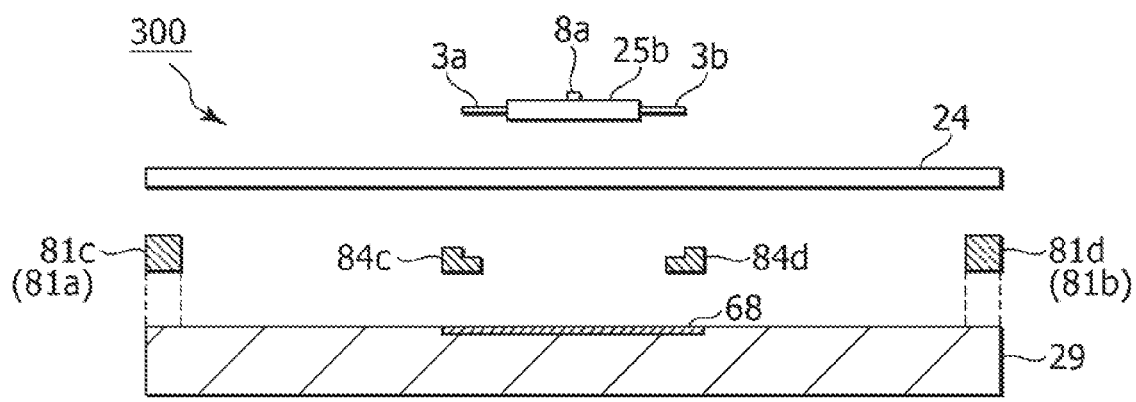
FIGS. 9A to 9C are views showing an example of the fabrication process for the touch panel supporting vibrator.
Figure 9B:
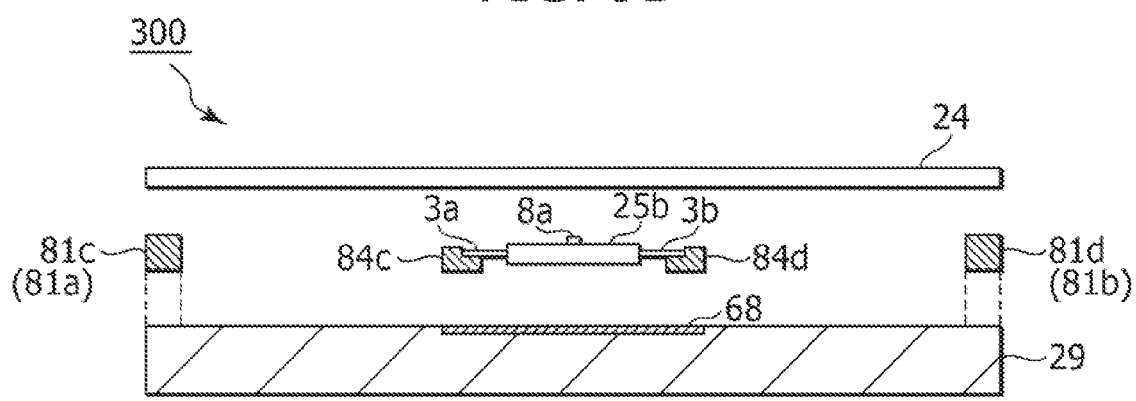
Figure 9C:
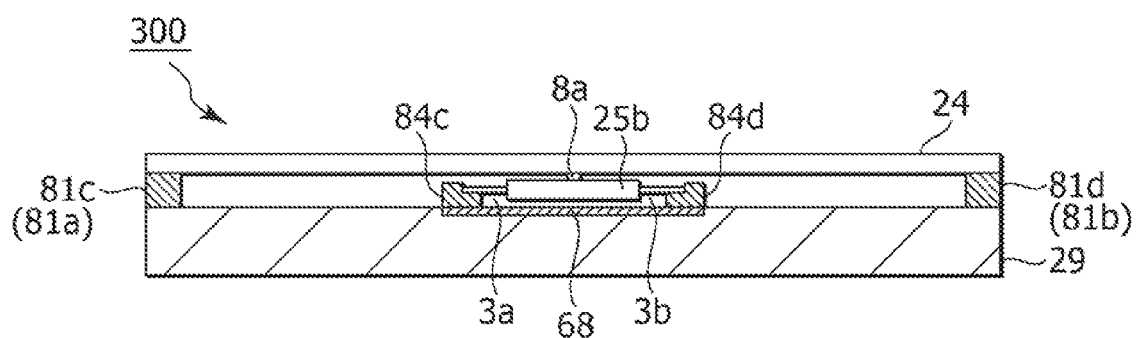

Next, the fabrication of the touch panel supporting vibrator 300 is described. FIGS. 9A to 9C are views showing an example of the fabrication process for the touch panel supporting vibrator 300 according to the third embodiment.

In the present embodiment, the touch panel supporting vibrator 300 which can be applied to, e.g., an input means or display means for use in mobile phones, personal digital assistants, or the like is formed. The touch panel supporting vibrator 300 has the four pillar portions 81a to 81d, and the part fitting spaces 82a, 82b are defined between the pillar portions 81a, 81b or between the pillar portions 81c, 81d, and, like the first and second embodiments, the piezoelectric actuators 25a, 25b are respectively fitted to the part fitting spaces 82a, 82b. It is preferred that each of the touch panel 24 and the display means 29 has a flat joint surface.

Under the above conditions for fabrication, the piezoelectric actuators 25a, 25b, touch panel 24, pillar portions 81a to 81d, and display means 29 shown in FIG. 9A are first prepared. The method of forming the piezoelectric actuator 25a and others is described above with reference to FIGS. 2 and 3, and the touch panel 24 and display means 29 are described above in connection with the first embodiment, and the descriptions of them are omitted. An example of the fabrication of the pillar portions 81a to 81d is described below.

The pillar portions 81a to 81d for defining the part fitting spaces are individually formed by, for example, cutting a rod made of a rigid plastic into a piece having a thickness of t3' (mm). Alternatively, the pillar portions 81a to 81d can be formed by making a predetermined mold for forming the pillar portion 81a or the like and subjecting a synthetic resin material to injection molding using the mold.

In this example, the printed wiring board 68 is formed on the surface of the display means 29 at a predetermined position, and the printed wiring board 68 is processed for forming the receiving electrodes 84a, 84b. For example, like the first embodiment, an electrode holder form having a step is formed to prevent the center electrodes 3a, 3b from shifting after the piezoelectric actuator 25a and others are mounted.

The steps of electrode holder form (part fitting spaces 82a, 82b) are formed by a printing or two-color molding technique on the display means 29 as a unified structure including the pillar portions 81a to 81d. Alternatively, the part fitting spaces 82a, 82b can be formed by a printing or two-color molding technique in the bottom of the touch panel 24 as viewed in the figure. Further alternatively, the printed board 68 can be formed on the substrate of the touch panel 24 or the display means 29 by a printing or two-color molding technique.

By virtue of the electrode holder form having a step, vibration can propagate to the touch panel surface, irrespective of the position of the touch panel supporting vibrator 300, for example, in the touch operation when the touch panel supporting vibrator 300 is held in a horizontal position, supine position, slanting position, or upright position. The receiving electrodes 84a, 84b are similar to those in the first embodiment, and the descriptions of them are omitted.

When fitting a piezoelectric laminate part, the center electrodes 3a, 3b of the piezoelectric actuator 25a are connected to the receiving electrodes 84a, 84b. In the pillar portions 81a to 81d, either an injection molded article or an article formed by cutting a metal member made of aluminum, iron, copper, or an alloy thereof may be used.

Next, the piezoelectric actuator 25a is mounted on the printed board 68 shown in FIG. 9B. The not shown piezoelectric actuator 25b is also mounted on the other side. In this example, a wiring is made through the wiring patterns 67a, 67b shown in FIG. 7.

Then, the pillar portions 81a, 81b, 81c, 81d are sandwiched and fixed between the touch panel 24 and the display means 29 shown in FIG. 9C. In this example, the pillar portions 81a, 81b, 81c, 81d are disposed respectively in the four corners. For example, the pillar portion 81c is disposed on the front left end of the display means 29 and the pillar portion 81a is disposed on the back left end, and the pillar portion 81b is disposed on the front right end and the pillar portion 81c is disposed on the back right end.

The pillar portions 81a, 81b, 81c, 81d are sandwiched and fixed between the touch panel 24 and the display means 29. One surface of each of the pillar portions 81a to 81d is bonded to the surface of the display means 29 through a bonding agent, and another surface is bonded to the back surface of the touch panel 24 through a bonding agent.

In this bonding, the vibration applying portion 8a of each of the piezoelectric actuators 25a, 25b is abutted against the bottom surface of the touch panel 24. Thus, there can be formed the touch panel supporting vibrator 300 which can be mounted on a mobile phone or the like.

With respect to the fabrication process for the touch panel supporting vibrator 300, the order of the steps for fabrication is not limited to the order described above, and the process may be performed in the following order: the piezoelectric actuators 25a, 25b are first mounted in the part fitting spaces 82a, 82b to be defined by the pillar portions 81a to 81d, and then the pillar portions 81a to 81d are formed on the display means 29 and the pillar portions 81a to 81d are sandwiched and fixed between the touch panel 24 and the display means 29.

In the touch panel supporting vibrator 300 according to the third embodiment, the touch panel 24 and the display means 29 are rigidly fixed to each other with the pillar portions 81a, 81b, 81c, 81d at the four corners.

Therefore, by using simple space keeping parts, such as the pillar portions 81a to 81d, or a simple space joint method, there is achieved a structure supporting the center electrodes 3a, 3b and vibration applying portion 8a of the piezoelectric actuator 25a and the like and the touch panel 24 as a planar input device. In addition, the number of the parts and the number of the steps for fabrication can be reduced, as compared to those in the first and second embodiments.

Thus, there can be provided a rigid vibration housing having fixed the display means 29 and the touch panel 24 and having a simple structure. Therefore, like the first and second embodiments, when the piezoelectric actuator 25a or the like is vibrated, irrespective of the position of the vibration housing being used, high reliability with respect to the vibration transmission can be surely achieved.

In the first to third embodiments, the vibration applying portion 8a is disposed so that it faces the touch panel, and the center electrodes 3a, 3b are disposed so that they face the display means, but the arrangement is not limited to this, and, when the vibration applying portion 8a is disposed so that it faces the display means and the center electrodes 3a, 3b are disposed so that they face the touch panel, a similar effect can be obtained.

The two piezoelectric actuators 25a, 25b are formed on the left and right sides of the display means or the like, but the number of the piezoelectric actuator(s) is not limited to this, and, when a single piezoelectric actuator is formed on the left or right side, it can give a haptic stimulus. In this case, the cost for the input device having a haptic function can be reduced.

Fourth Embodiment

Figure 10:
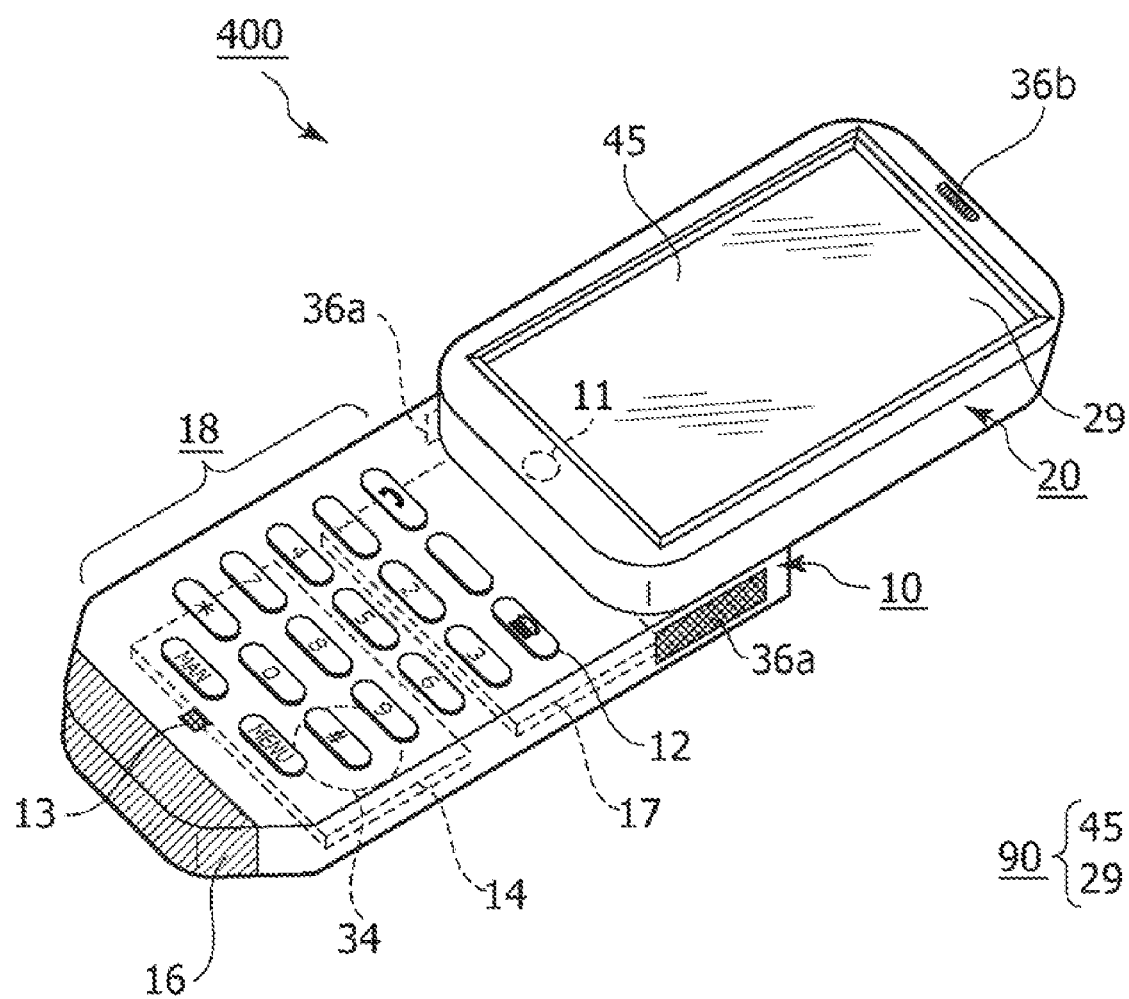
FIG. 10 is a perspective view showing an example of the construction of a mobile phone having a haptic input function according to a fourth embodiment.

FIG. 10 is a perspective view showing an example of the construction of a mobile phone 400 having a haptic input function according to the fourth embodiment.

In the present embodiment, the mobile phone includes any one of the touch panel supporting vibrator 100, 200, and 300 according to the first, second, or third embodiment, and vibrates an input detection surface on the display means 29 in accordance with the vibration pattern corresponding to the press force at the position of the input detection surface pushed by an operating body, and gives a haptic stimulus in response to the pushing operation by the operating body for the input detection surface and settles the input of a button icon or the like displayed on the display means 29.

The mobile phone 400 shown in FIG. 10 constitutes an example of the electronic device, and has an input device 90 having a haptic function, which is operated by pressing or contacting the input detection surface on the display screen. The mobile phone 400 has a lower housing 10 and an upper housing 20, and the housings 10 and 20 are movably engaged by a rotating range mechanism 11. In the rotating range mechanism, a not shown shaft portion formed at one end of the operation surface of the lower housing 10 and a not shown bearing portion formed at one end of the back surface of the lower housing 10 are rotatably engaged, and the upper housing 20 is bonded with plane to the lower housing 10 with freedom of the rotation at an angle of ±180°.

An operation panel 18 having a plurality of push button switches 12 is formed in the lower housing 10. The push button switches 12 are composed of "0" to "9" numerical keys, symbol keys of "*", "#", and others, hook buttons of "ON", "OFF", and others, menu keys, and the like. In the lower housing 10, a microphone 13 for call is formed in the operation panel surface at the lower portion, and functions as a transmitter.

A module-type antenna 16 is fitted to the lower end of the lower housing 10, and a loudspeaker 36a for loud sound is formed at sides but inside of the upper end and emits sound of receiving melody or the like. A battery 16, a circuit board 17, and others are formed in the lower housing 10, and a camera 34 is fitted to the back surface of the lower housing 10.

A loudspeaker 36b for call is formed in the upper portion of the surface of the upper housing 20 which is movably engaged with the lower housing 10 by the rotating range mechanism 11, and functions as a receiver. The input device 90 having a haptic function is formed under the loudspeaker-fitted surface of the upper housing 20. In the input device 90, for example, the touch panel supporting vibrator 300 is used.

The input device 90 has input detector means 45 and display means 29, and gives a haptic stimulus in response to the pushing operation by an operating body for the input detection surface on the display screen. Input information, such as a plurality of button icons, is displayed on the display means 29.

Figure 11:
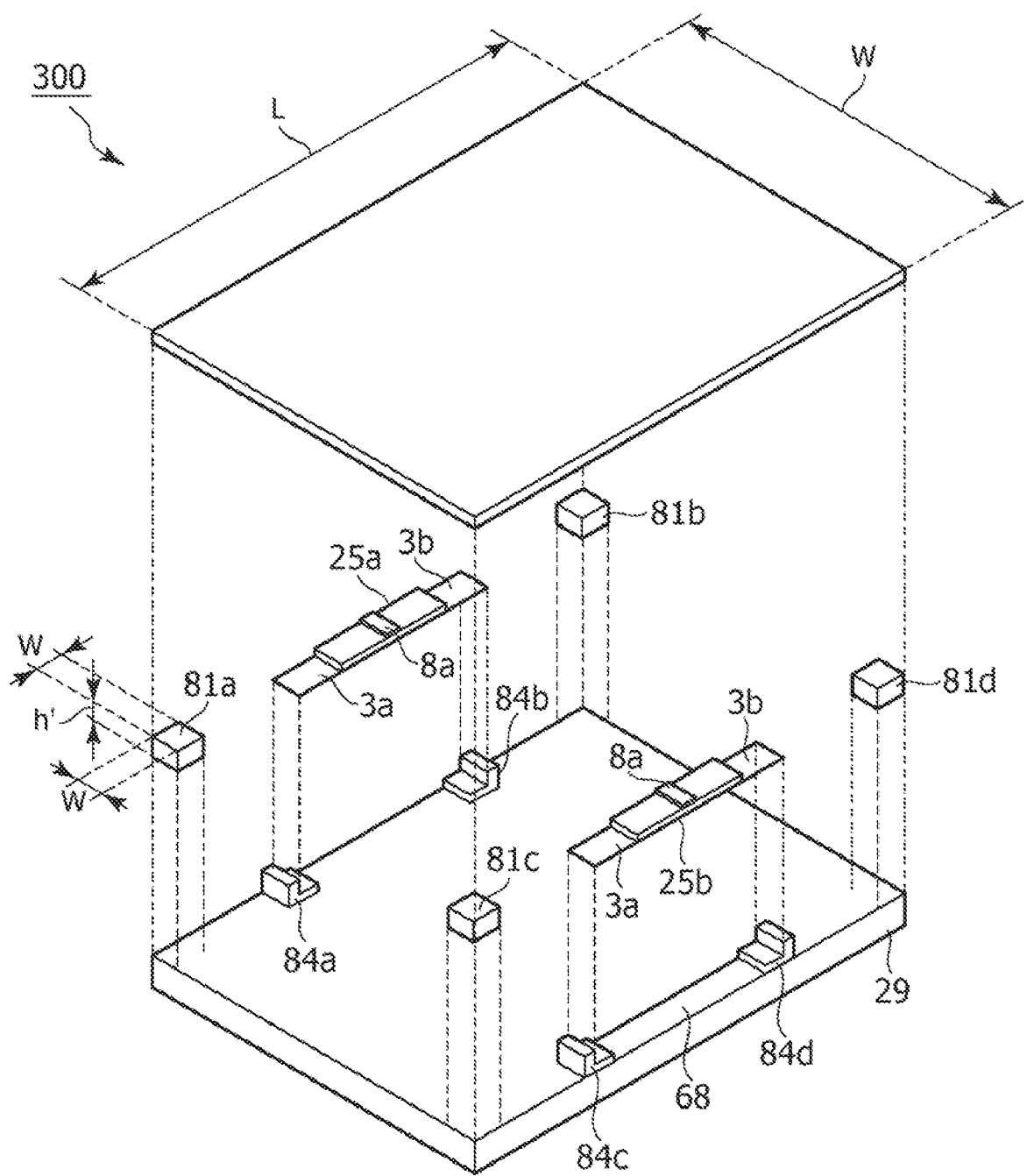
FIG. 11 is an exploded view showing an example of the construction of the touch panel supporting vibrator in an input device having a haptic function.

FIG. 11 is an exploded view showing an example of the construction of the touch panel supporting vibrator 300 in the input device 90 having a haptic function.

The touch panel supporting vibrator 300 shown in FIG. 11 has a touch panel 24 having a width of W (mm) and a length of L (mm), display means 29, and others. The touch panel 24 and the display means 29 are stacked on one another. In this example, pillar portions 81a, 81b, 81c, 81d (four corner portions) are disposed in the four corners of the display means 29, and the touch panel 24 and the display means 29 are rigidly fixed to each other with the pillar portions 81a, 81b, 81c, 81d. The pillar portions 81a and others have a width of w (mm), a length of w (mm), and a height of h' (mm).

A piezoelectric actuator 25a is disposed in a part fitting space 82a defined between the pillar portion 81a and the pillar portion 81b, and a piezoelectric actuator 25b is disposed in a part fitting space 82b defined between the pillar portion 81c and the pillar portion 81d. For example, a vibration applying portion 8a of the piezoelectric actuator 25a is disposed so that it faces the touch panel 24, and center electrodes 3a, 3b constituting the vibration supporting portions are disposed so that they face the display means 29. The vibration applying portion 8a is abutted against the bottom surface of the touch panel 24, so that the vibration propagates in the direction pushing up the touch panel 24.

A printed board 68 is formed in the part fitting space 82b, and a wiring 67 in a sheet form is connected to the printed board from the outside (see FIG. 7). Receiving electrodes 84c, 84d are formed on the printed board 68, and, after the piezoelectric actuator 25b is mounted, the center electrode 3a and the receiving electrode 84c are soldered together, and the receiving electrode 84d and the center electrode 3b are soldered together. Receiving electrodes 84a, 84b are formed on the side of the part fitting space 82a, and, after the piezoelectric actuator 25a is mounted, the center electrode 3a and the receiving electrode 84a are soldered together, and the center electrode 3b and the receiving electrode 84b are soldered together. By virtue of employing this electrode structure, vibration can propagate to the touch panel surface, irrespective of the position of the touch panel supporting vibrator 300, for example, in the operation when the touch panel supporting vibrator 300 is held in a horizontal position, supine position, slanting position, or upright position.

Figure 12:
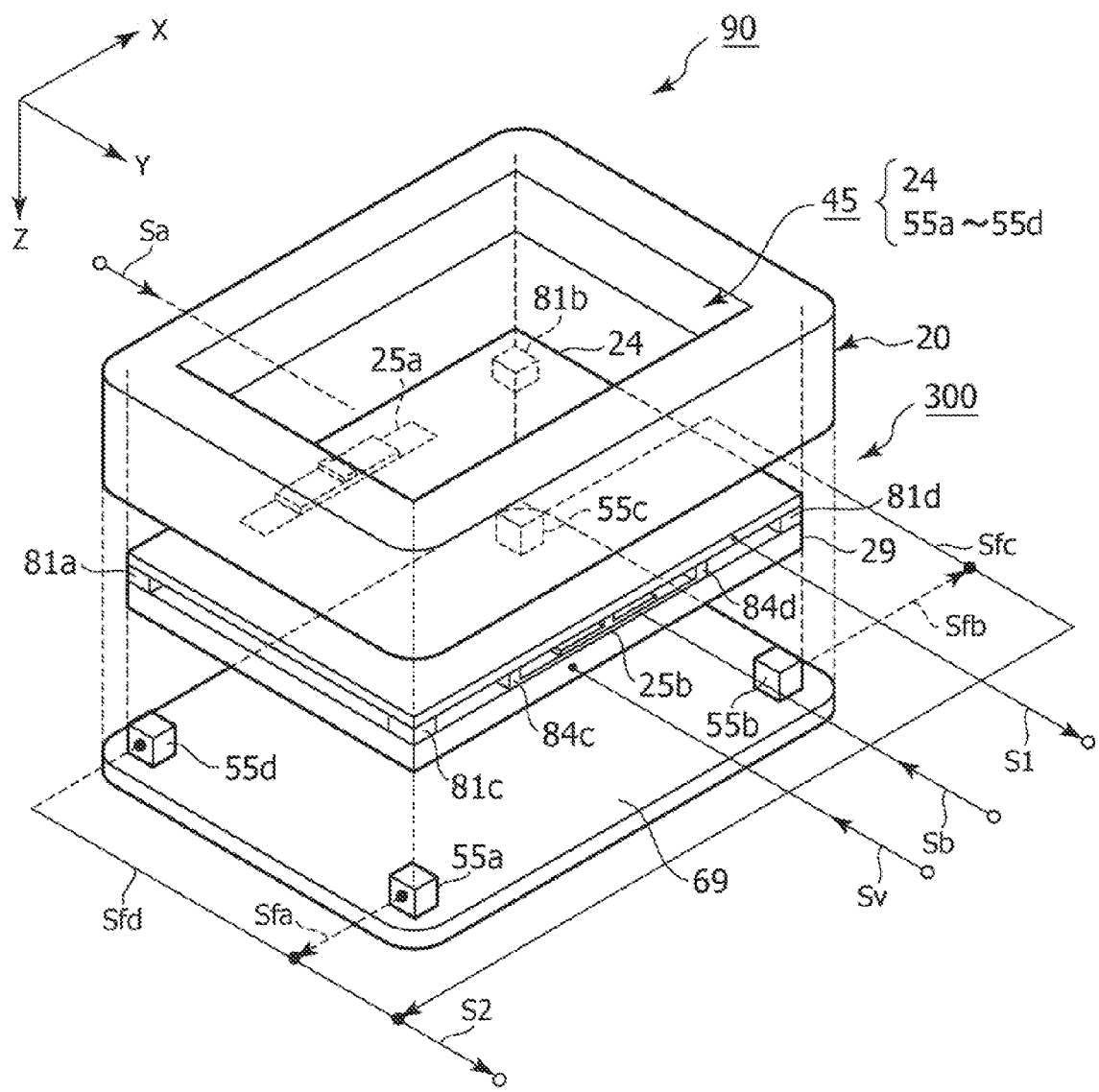
FIG. 12 is a perspective view showing an example of the structure of the input device.

FIG. 12 is a perspective view showing an example of the structure of the input device 90 having a haptic function. The input device 90 shown in FIG. 12 is a device such that an input operation is made on the display screen by contacting one of the icons displayed on the display screen for input item selection, and gives a haptic stimulus to a finger of an operator, that is, operating body, during the information input operation.

The input device 90 includes an upper housing 20, force detector means 55a to 55d, a body substrate 69, and a touch panel supporting vibrator 300. In this example, the force detector means 55a to 55d and touch panel supporting vibrator 300 are disposed on the body substrate 69, and the upper housing 20 is assembled so as to cover them. The touch panel 24 of the touch panel supporting vibrator 300 and the force detector means 55a to 55d on the body substrate 69 constitute an input detector means 45.

The input device 90 gives a haptic stimulus to a finger of an operator in response to the input operation for the input detector means 45 using the piezoelectric actuators 25a, 25b in the touch panel supporting vibrator 300. In this example, one direction on the input detection surface of the input detector means 45 is referred to as "X direction", another direction perpendicular to the X direction is referred to as "Y direction", and the direction perpendicular to the X and Y directions is referred to as "Z direction".

The touch panel 24 detects the selected position of button icon. The input information obtained from the touch panel 24 includes position detection data. The position detection data is obtained by a position detection signal S1 upon pushing the button icon, and output to the control system. In the touch panel 24, an electrostatic capacitive input device is used, and not shown storage electrodes (transparent electrodes) are arranged in a matrix form.

Under the touch panel 24 is disposed a display means 29 having a size almost equivalent to the size of the touch panel. As the display means 29, a liquid crystal display device is used. The liquid crystal display device has a not shown backlight. The touch panel 24 and display means 29 constitute a body to be vibrated. The display means 29 operates so that an icon is displayed in response to the position detection signal S1 obtained from the touch panel 24 and a display signal Sv fed from the control system.

In this example, the piezoelectric actuators 25a, 25b are formed between the touch panel 24 and the display means 29, and a vibration control signal Sa (voltage) is fed to the center electrodes 3a, 3b. The piezoelectric actuator 25a vibrates the display screen (input operation surface) from the backlight side according to the vibration control signal Sa. The piezoelectric actuator 25b vibrates the display screen from the backlight side according to a vibration control signal Sb.

In each of the piezoelectric actuators 25a, 25b, the both sides (convex portions) of the shim 3 shown in FIG. 3B have elasticity. The elasticity of the convex portions of the shim 3 is utilized to cause the piezoelectric element itself to vibrate in the vertical direction. In other words, the piezoelectric element itself vibrates in the direction parallel with the direction of the transmitted light from the backlight of the liquid crystal display device, making it possible to give a haptic stimulus to a finger of an operator or the like in contact with the touch panel 24.

The vibration control signals Sa and Sb are fed to the piezoelectric actuators 25a, 25b from the control system. The vibration control signals Sa and Sb are signals for generating a plurality of vibration patterns, and are fed to the piezoelectric actuators 25a and 25b when, for example, an operator touches one of the icons displayed on the display means 29.

In the four corners of the body substrate 69, for example, the force detector means 55a to 55d each having a square form are formed, and detect the press force applied to the touch panel 24 by a finger of an operator to output force detection data, and settle the input information displayed at the pushed position. The force detector means 55a detects, for example, a force detection signal Sfa upon selecting the icon as an input amount (press force in the Z direction) at the lower right corner.

Similarly, the force detector means 55b detects a force detection signal Sfb upon selecting the icon as an input amount (force) at the upper right corner, the force detector means 55c detects a force detection signal Sfc upon selecting the icon as an input amount (force) at the upper left corner, and the force detector means 55d detects a force detection signal Sfd upon selecting the icon as an input amount (force) at the lower left corner. The four force detector means 55a to 55d are connected in parallel, and output the four force detection signals Sfa+Sfb+Sfc+Sfd to the control system. Hereinafter, the resultant total signal is referred to as "input detection signal S2". The input detection signal S2 is output to the control system.

The touch panel 24, display means 29, and body substrate 69 are contained in and protected by the upper housing 20. The upper housing 20 is composed of, for example, a plate article of stainless steel having a thickness of about 0.3 mm, and has a window portion through which the touch panel 24 is exposed, and is assembled so as to cover the touch panel supporting vibrator 300 formed on the body substrate 69, thus constituting the input device 90 having a haptic function.

Figure 13:
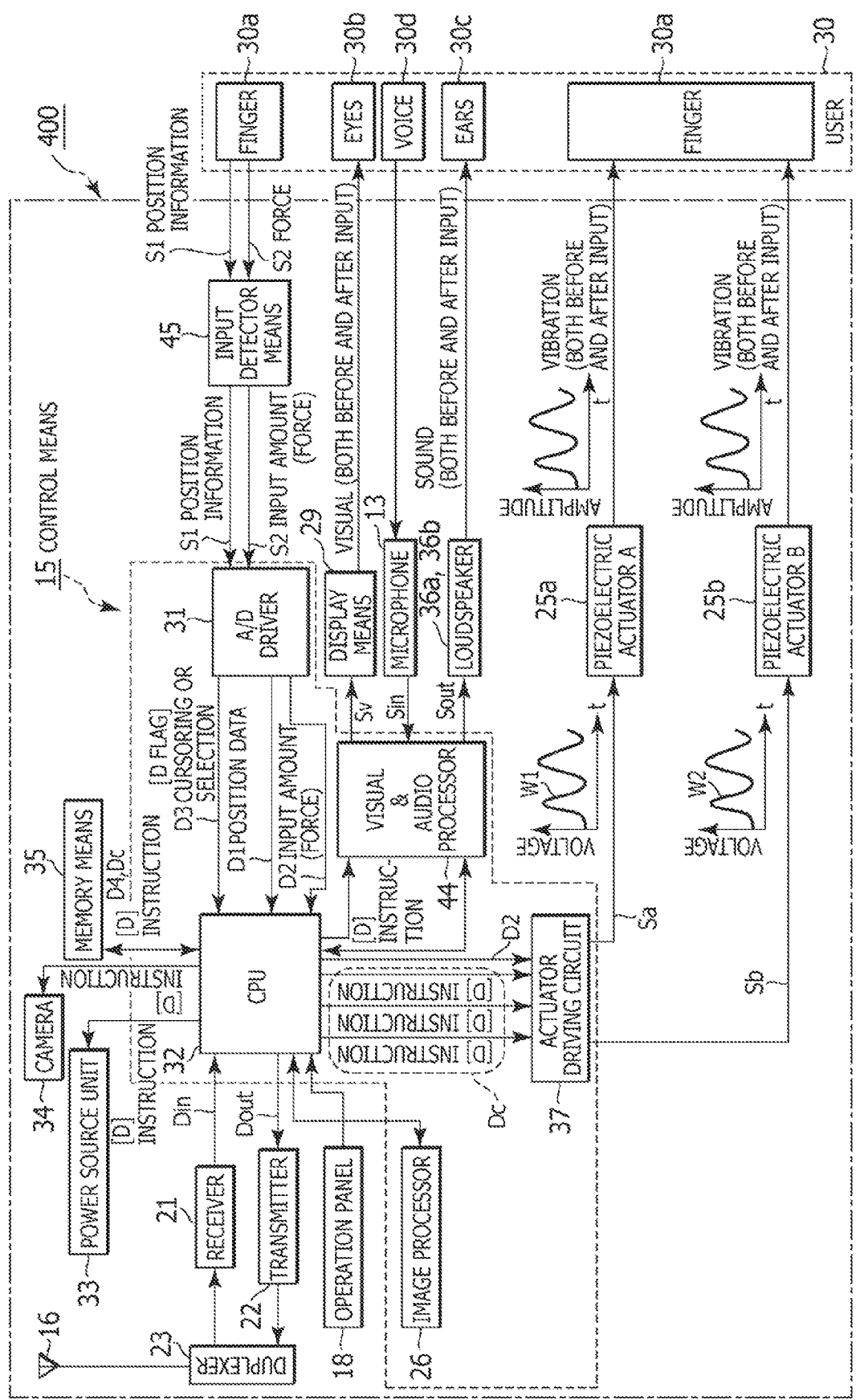
FIG. 13 is a block diagram showing an example of the construction of a control system of the mobile phone having a haptic input function.

Next, an example of the construction of the control system of the mobile phone 400 having a haptic input function and a haptic feedback input method are described. FIG. 13 is a block diagram showing an example of the construction of the control system of the mobile phone 400 having a haptic input function.

The mobile phone 400 shown in FIG. 13 has blocks of individual functions mounted on the circuit board 17 in the lower housing 10. In FIG. 13 and FIGS. 10 to 12, like parts or means are indicated by like reference numerals. The mobile phone 400 has control means 15, an operation panel 18, a receiver 21, a transmitter 22, an antenna duplexer 23, input detector means 45, display means 29, a power source unit 33, a camera 34, memory means 35, and piezoelectric actuators 25a and 25b.

With respect to the input detector means 45 shown in FIG. 13, a capacitive input device is described in connection with FIG. 12, but an input device of any type can be used as long as it can distinguish between the cursoring and the action of selection, and the input detector means may be, for example, a resistive, surface acoustic wave (SAW), optical, or multi-stage tact switch input device, preferably an input device which can send position detection data and force detection data to the control means 15. Into the input detector means 45 are input at least a position detection signal S1 and an input detection signal S2 indicating input amount (press force F) through a finger 30a of an operator 30.

The control means 15 constitutes a control system, and has an image processor 26, an A/D driver 31, a CPU 32, and an actuator driving circuit 37. To the A/D driver 31 are fed a position detection signal S1 and an input detection signal S2 from the input detector means 45. For distinguishing between the cursoring and the action of icon selection, the A/D driver 31 converts an analog signal composed of the position detection signal S1 and input detection signal S2 to digital data. In addition, the A/D driver 31 conducts operation of the resultant digital data and detects cursoring input or icon selection information, and feeds flag data D3 for distinguishing between the cursoring input and the icon selection, or position detection data D1 or input detection data D2 to the CPU 32. These operations may be executed within the CPU 32.

The CPU 32 is connected to the A/D driver 31. The CPU 32 controls the whole of the mobile phone on the basis of the system program. System program data for controlling the whole of the mobile phone is stored in the memory means 35. A not shown RAM is used as a work memory. The power source is turned on and then, the CPU 32 reads the system program data from the memory means 35 and sends it to the RAM, and starts the system to control the whole of the mobile phone. For example, the CPU 32 controls the whole of the mobile phone so that the CPU receives the position detection data D1, input detection data D2, and flag data D3 from the A/D driver 31 (hereinafter, frequently referred to simply as "input data") and feeds predetermined instruction data D to the power source unit 33 or a device, such as the camera 34, memory means 35, actuator driving portion 37, or a visual & audio processor 44, or takes in the received data from the receiver 21, or transfers the transmitted data to the transmitter 2.

In this example, the CPU 32 compares the input detection data D2 obtained from the input detector means 45 with a pushing judgment threshold Fth preliminarily set, and controls the actuator driving portion 37 so that vibration of the piezoelectric actuators 25a and 25b or the like is controlled in accordance with the result of the comparison. For example, when haptic stimuli propagated from the input detection surface in the pushed position of the input detector means 45 are taken as "A" and "B". The haptic stimulus "A" is obtained by changing the input detection surface responding to the press force F of the finger 30a of the operator in the pushed position from a vibration pattern having a low frequency and small amplitude to a vibration pattern having a high frequency and large amplitude. The haptic stimulus "B" is obtained by changing the input detection surface responding to the press force F of the finger 30a of the operator in the pushed position from a vibration pattern having a high frequency and large amplitude to a vibration pattern having a low frequency and small amplitude.

The memory means 35 is connected to the CPU 32 and, for example, display data D4 for three-dimensional display, and control data Dc about the selected position and vibration mode of the icon corresponding to the display data D4 is stored per display screen for input item selection. The control data Dc includes an algorism which can generate different haptic stimuli synchronizing with the applications in the display means 29 (three-dimensional display and various display contents) and set a plurality of specific vibration waveforms for generating the haptic stimuli and specific haptic stimulus generation modes for the respective applications. As the memory means 35, an EEPROM, an ROM, an RAM, or the like is used.

In this example, the CPU 32 controls display of the display means 29 and output of the piezoelectric actuators 25a and 25b on the basis of the position detection data D1, input detection data D2, and flag data D3 output from the A/D driver 31. For example, the control means 15 reads the control data Dc from the memory means 35 in response to the position detection signal S1 obtained from the touch panel 24 and the input detection signal S2 obtained from the force detector means 55a to 55d to feed the vibration control signals Sa, Sb to the piezoelectric actuators 25a and 25b.

The CPU 32 controls the actuator driving circuit 37 so that, for example, when the input detector means 45 detects input detection data D2 more than the pushing judgment threshold Fth, the haptic stimulus "A" is started, and then, when the input detector means detects input detection data D2 less than the pushing judgment threshold Fth, the haptic stimulus "B" is started. By virtue of such a control, different vibration patterns can be generated depending on the "press force" of the finger 30a of the operator or the like.

The actuator driving portion 37 is connected to the CPU 32 to generate vibration control signals Sa, Sb in accordance with the control data Dc from the CPU 32. The vibration control signals Sa, Sb individually have output waveforms composed of a sine waveform. The two piezoelectric actuators 25a, 25b are connected to the actuator driving portion 37, and vibrate based on the respective vibration control signals Sa, Sb.

In this example, the actuator driving portion 37 stores the pushing judgment threshold Fth corresponding to each application. For example, the pushing judgment threshold Fth is preliminarily stored as a trigger parameter in a ROM or the like formed in the actuator driving circuit 37. The actuator driving circuit 37 inputs the input detection data D2 under control of the CPU 32, and compares the pushing judgment threshold Fth preliminarily set with the press force F obtained from the input detection data D2 to execute processing of Fth>F judgment or Fth≦F judgment.

In this example, when the pushing judgment threshold Fth is 100 (gf), the input detection surface is vibrated according to a vibration pattern for obtaining a haptic stimulus of a classic switch. When the pushing judgment threshold Fth is 20 (gf), the input detection surface is vibrated according to a vibration pattern for obtaining a haptic stimulus of a cyber switch.

In addition to the actuator driving portion 37, the image processor 26 is connected to the CPU 32, and image-processes the display data D4 for three-dimensionally displaying a button icon 29a and others. The image-processed display data D4 is fed to the display means 29. In this example, the CPU 32 controls display of the display means 29 so that the button icon in the display screen is three-dimensionally displayed so as to have a distance in the depth direction.

In the input device 90 having the above-described construction, for example, pushing or touching one of the button icons displayed on the display screen for input item selection and pushing the touch panel 24 on the display screen in the Z direction allows an operation of screen input with haptic stimuli. The operator 30 receives a vibration with the finger 30a as a haptic stimulus, and feels vibration every button icon.

The display contents on the display means 29 are recognized by visual perception by means of eyes of an operator, or the sound emitted from the loudspeakers 36a, 36b or the like is recognized by auditory perception by means of ears of an operator. The operation panel 18 is connected to the CPU 32, and used for, for example, manually inputting the telephone number of a person on the other end. In addition to the above icon selection screen, a receiving image may be displayed on the display means 29 in accordance with a visual signal Sv.

The antenna 16 shown in FIG. 13 is connected to the antenna duplexer 23, and receives from a base station or the like a radio wave of a person on the other end upon receiving a phone call. The receiver 21 is connected to the antenna duplexer 23, and receives the received data introduced from the antenna 16 to demodulate the image or sound, and outputs the demodulated visual and audio data Din to the CPU 32 or the like. The visual & audio processor 44 is connected to the receiver 21 through the CPU 32, and digital/analog-converts the digital audio data to output an audio signal Sout, or digital/analog-converts the digital visual data to output a visual signal Sv.

The loudspeaker 36a for loud sound and the loudspeaker 36b constituting a receiver are connected to the visual & audio processor 44. The loudspeaker 36a emits a ring tone, a ring tone melody, or the like upon receiving a phone call. The loudspeaker 36b inputs the audio signal Sin to expand speaking voice 30d of a person on the other end. In addition to the loudspeakers 36a, 36b, the microphone 13 constituting a transmitter is connected to the visual & audio processor 44, and collects voice of the operator to output the audio signal Sout. Upon making a call, the visual & audio processor 44 analog-digital-converts the analog audio signal Sin to be sent to a person on the other end to output digital audio data, or analog-digital-converts the analog visual signal Sv to output digital visual data.

In addition to the receiver 21, the transmitter 22 is connected to the CPU 32, and modulates the visual and audio data Dout to be sent to a person on the other end, and feeds the modulated transmitted data to the antenna 16 through the antenna duplexer 23. The antenna 16 radiates the radio wave fed from the antenna duplexer 23 toward a base station or the like.

In addition to the transmitter 22, the camera 34 is connected to the CPU 32, and takes a picture and transmits, for example, still image information or operation information to a person on the other end through the transmitter 22. The power source unit 33 has a battery 14, and feeds DC power source to the CPU 32, operation panel 18, receiver 21, transmitter 22, input detector means 45, piezoelectric actuators 25a and 25b, display means 29, camera 34, and memory means 35.

Figure 14A:
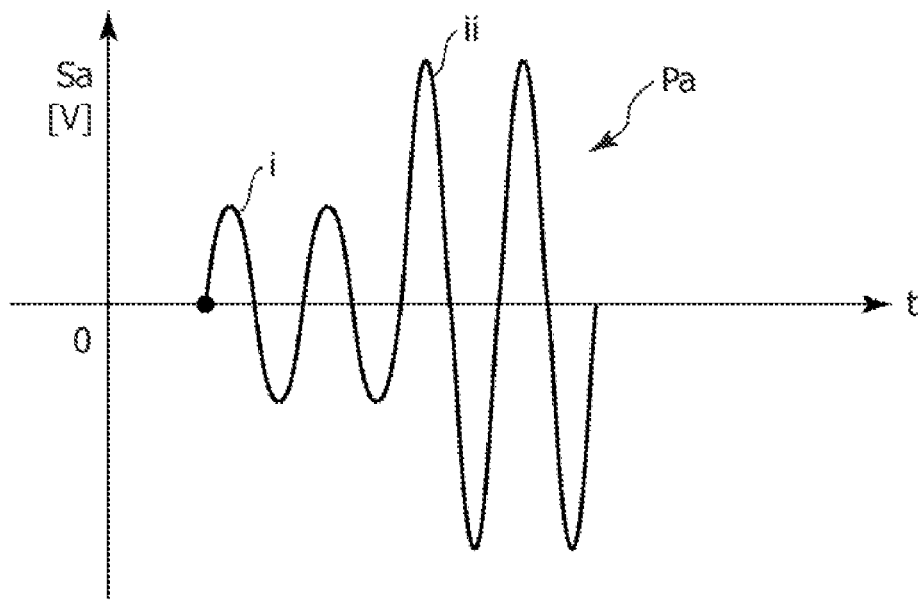
FIGS. 14A and 14B are waveform charts showing examples of vibration patterns of a haptic stimulus "A" and a haptic stimulus "B".
Figure 14B:
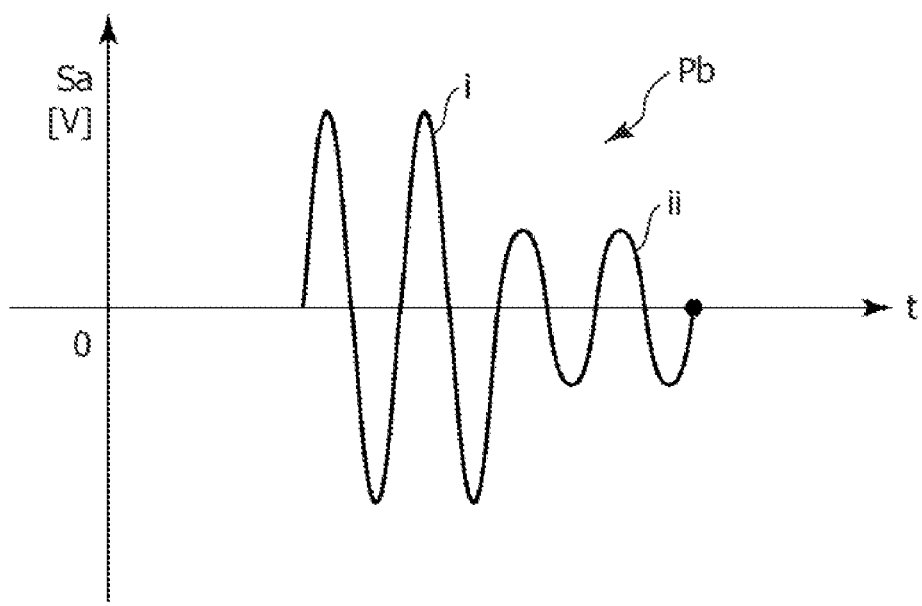

FIGS. 14A and 14B are waveform charts showing examples of vibration patterns of the haptic stimulus "A" and the haptic stimulus "B". In each of FIGS. 14A and 14B, a time t is taken as the abscissa. A voltage (amplitude Ax)(V) of the vibration control signals Sa, Sb or the like is taken as the ordinate. In this example, the haptic stimulus "A" is given when the button icon 29a or the like is pushed, and the haptic stimulus "B" is given when the pushed button icon 29a or the like is released.

The first vibration pattern Pa shown in FIG. 14A has a waveform giving the haptic stimulus "A". The driving requirement "a" for the haptic stimulus "A" is that the pushing judgment threshold Fth and the press force F satisfy the relationship: Fth<F when the button icon 29a or the like is pushed, and vibration on the first stage i is made with a vibration pattern of frequency fx=50 Hz, amplitude Ax=5 µm, and number Nx=2 (hereinafter, indicated by "[fx Ax Nx]=[50 5 2]") for about 0.1 second, and similarly vibration on the second stage ii is made with a vibration pattern of [fx Ax Nx]=[100 10 2] for about 0.1 second.

The second vibration pattern Pb shown in FIG. 14B has a waveform giving the haptic stimulus "B". The driving requirement "b" for the haptic stimulus "B" is that the pushing judgment threshold Fth and the press force F satisfy the relationship: Fth>F when the pushed button icon 29a or the like is released, and vibration on the first stage i is made with a vibration pattern of [fx Ax Nx]=[80 8 2] for about 0.1 second, and similarly vibration on the second stage ii is made with a vibration pattern of [fx Ax Nx]=[40 8 2] for about 0.1 second. By vibrating the input detection surface based on these vibration patterns, a haptic stimulus of cyber switch or the like can be obtained.

Figure 15A:
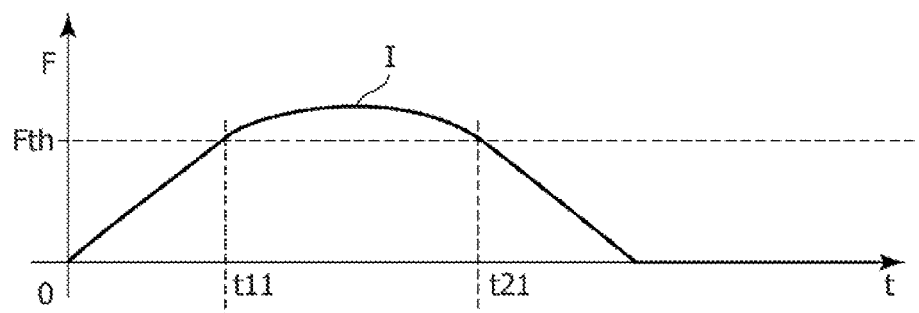
FIGS. 15A and 15B are diagrams showing an example of the relationship (No. 1) between press force F and the vibration pattern.
Figure 15B:
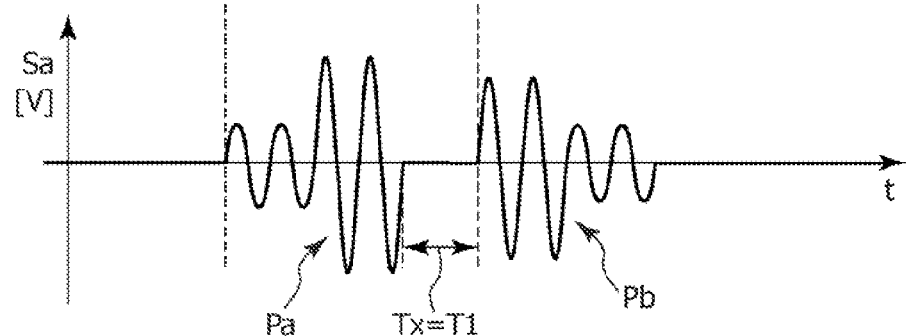

FIGS. 15A and 15B are diagrams showing an example of the relationship (No. 1) between the press force F and the vibration pattern. In FIG. 15A, the press force F is taken as the ordinate, and is obtained from the input detection signal S2 (corresponding to the binary signal of input detection data D2). In FIG. 15B, a voltage (amplitude) of the vibration control signal Sa or the like is taken as the ordinate. In each of FIGS. 15A and 15B, a time t is taken as the abscissa.

Generally, an input motion peak exists in a button switch operation and the like. It is known that press force F is about 30 (gf) to 240 (gf) at a pushing speed (operation input speed) as estimated at the design. The press force distribution waveform I shown in FIG. 15A reflects press force F caused at the pushing speed in the Z direction which is set as a reference at the design of the input device.

In this example, the pushing judgment threshold Fth is preliminarily set with respect to the input detection signal S2 obtained from the input detector means 45. The CPU 32 controls the actuator vibration circuit 37 so that a first vibration pattern Pa is generated at a time t11 at which the rising waveform of the input detection signal S2 goes across the pushing judgment threshold Fth and a second vibration pattern Pb is generated at a time t21 at which the falling waveform of the input detection signal S2 goes across the pushing judgment threshold Fth.

In this case, the input detector means 45 detects the press force F set as a reference at the design of the input device, and, when the CPU 32 or the like detects the relationship: pushing judgment threshold Fth<press force F, the haptic stimulus "A" can be started, or when the CPU 32 or the like detects the relationship: pushing judgment threshold Fth>press force F, the haptic stimulus "B" can be started. Between the vibration pattern Pa and the vibration pattern Pb is formed a blank term Tx=T1 with no vibration. The blank term Tx is variable depending on the pushing speed in the Z direction.

Figure 16A:
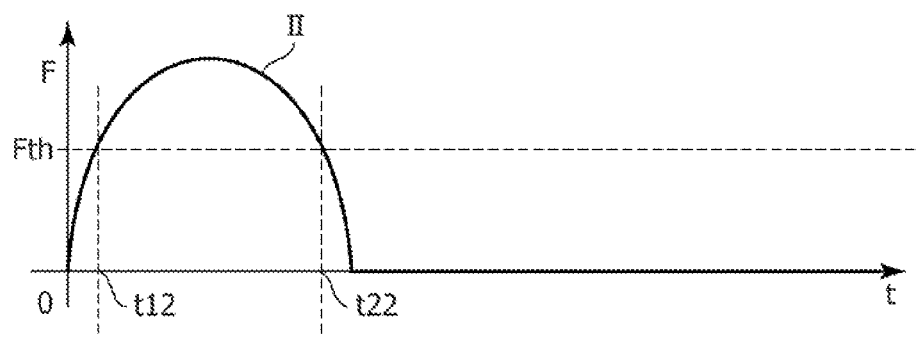
FIGS. 16A and 16B are diagrams showing an example of the relationship (No. 2) between the press force F and the vibration pattern.
Figure 16B:
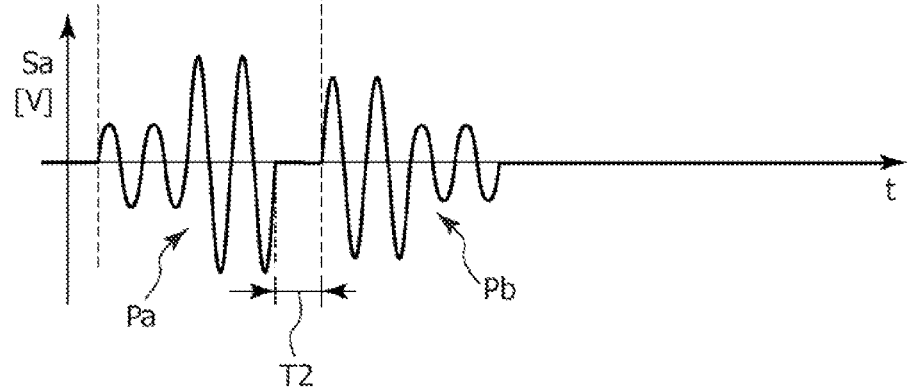

FIGS. 16A and 16B are diagrams showing an example of the relationship (No. 2) between the press force F and the vibration pattern. In FIG. 16A, the press force F is taken as the ordinate, and is obtained from the input detection signal S2 (corresponding to the binary signal of input detection data D2). In FIG. 16B, a voltage (amplitude) of the vibration control signal Sa or the like is taken as the ordinate. In each of FIGS. 16A and 16B, a time t is taken as the abscissa.

The press force distribution waveform II shown in FIG. 16A reflects press force F caused when the button icon or the like is pushed at a speed faster than the reference pushing speed shown FIG. 15A. In this example, like FIG. 15A, the pushing judgment threshold Fth is preliminarily set with respect to the input detection signal S2 obtained from the input detector means 45. The CPU 32 controls the actuator vibration circuit 37 so that a vibration pattern Pa is generated at a time t12 at which the rising waveform of the input detection signal S2 goes across the pushing judgment threshold Fth and a vibration pattern Pb is generated at a time t22 at which the falling waveform of the input detection signal S2 goes across the pushing judgment threshold Fth.

In this case, the input detector means 45 detects the press force F caused when the button icon or the like is pushed at a speed faster than the reference pushing speed, and, when the CPU 32 or the like detects the relationship: pushing judgment threshold Fth<press force F, the haptic stimulus "A" can be started. On the other hand, when the CPU 32 or the like detects the relationship: pushing judgment threshold Fth>press force F, the haptic stimulus "B" can be started. Between the vibration pattern Pa and the vibration pattern Pb is formed a blank term Tx=T2 (T2<T1) with no vibration.

Even when pushed at a pushing speed faster than the pushing speed set at the design, the haptic stimulus "A" is propagated on the first stage to achieve a load having a feeling of clicking, and the haptic stimulus "B" is propagated on the second stage to achieve a stroke having a feeling of clicking. In this example, when the pushing judgment threshold Fth is 100 (gf), a haptic stimulus of a classic switch can be obtained.

Figure 17:
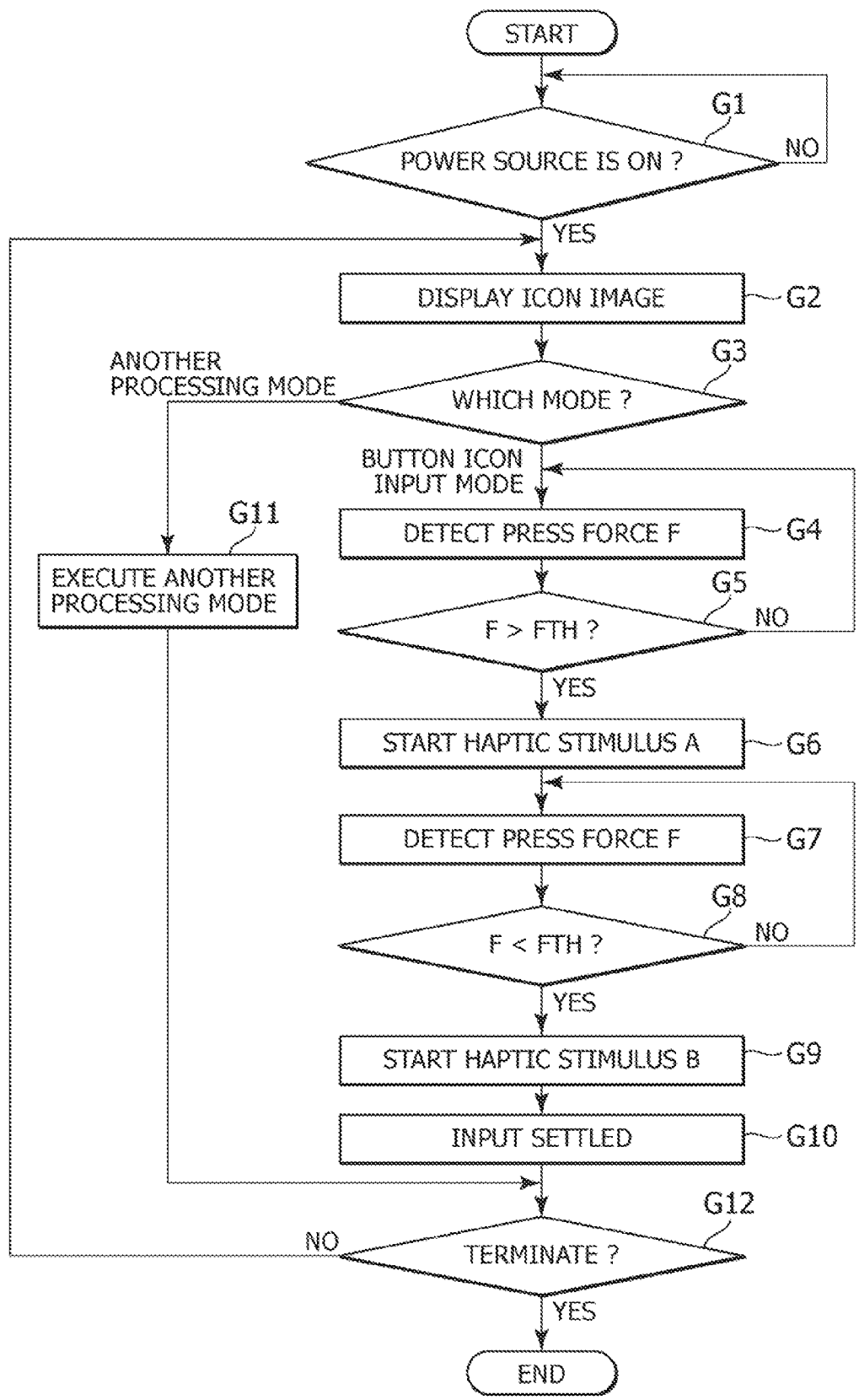
FIG. 17 is a flowchart showing an example of the information processing in the mobile phone according to the fourth embodiment.
Figure 18:
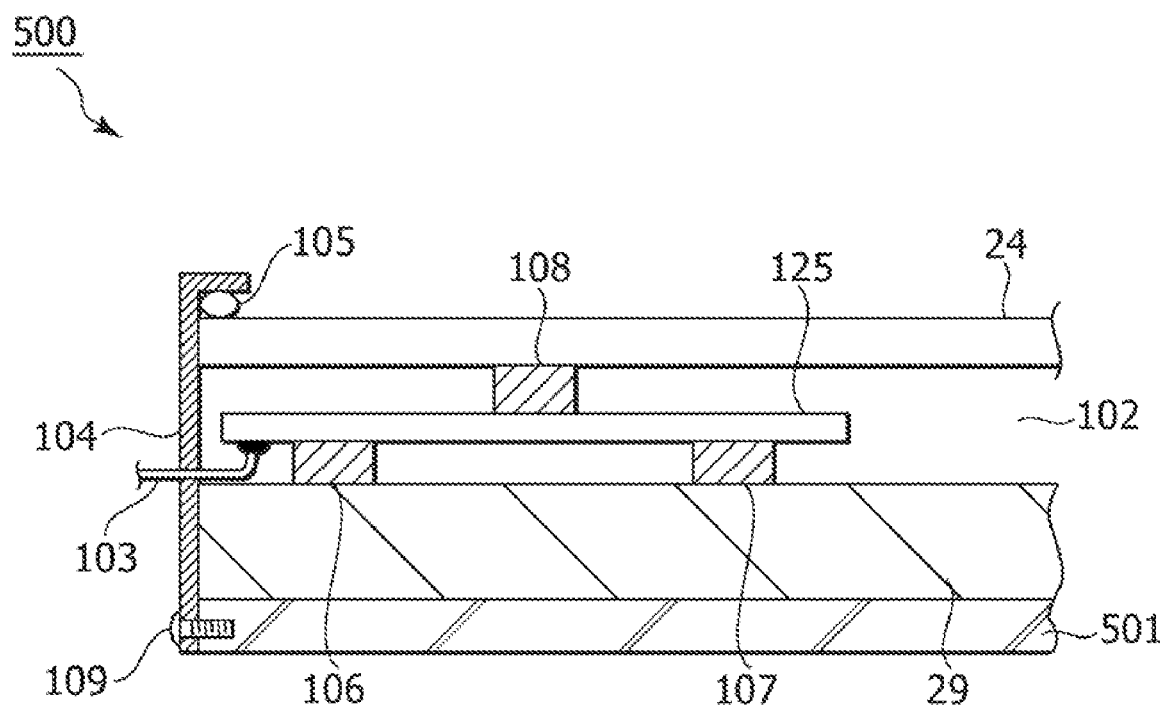
FIG. 18 is a cross-sectional view showing an example of the structure of a related art touch panel supporting vibrator.

Next, an example of the information processing in the mobile phone 400 is described. FIG. 17 is a flowchart showing an example of the information processing in the mobile phone 400 according to the fourth embodiment.

In this example, the mobile phone 400 has the touch panel supporting vibrator 100, 200, or 300 according to the first, second, or third embodiment, and information is input by pushing the input detection surface on the display screen of the mobile phone 400 by means of a finger 30a of an operator. The mobile phone 400 has a function (algorism) such that a waveform is processed using press force F caused by the finger 30a of the operator or the like as a parameter in the same vibration mode. The CPU 32 calculates press force F from the input detection data D2, and judges it according to the driving requirements a, b shown in FIG. 15A, making it possible to generate an appropriate haptic stimulus according to the pushing action during the input operation in the same vibration mode for any types of inputs.

Under the above information processing conditions, in a step G1 in the flowchart shown in FIG. 17, the CPU 32 waits for a power source ON. For example, the CPU 32 detects power source ON information to start the system. The power source ON information is generally generated when a clock function or the like works and the power source switch of a mobile phone or the like in a sleeping state is turned ON.

The procedure then goes to a step G2 and the CPU 32 controls the display means 29 so that an icon image is displayed. For example, the CPU 32 feeds display data D4 to the display means 29 to display input information on the display screen. The input information displayed on the display screen is made visible through the input detector means 45 having an input detection surface. The procedure then goes to a step G3 and the CPU 32 divides the control according to a button icon input mode or another processing mode. The button icon input mode is an input operation of pushing an icon button 29a or the like on the input detection surface when selecting a button icon.

When the button icon input mode is selected, the button icon 29a or the like is pushed, and hence the procedure goes to a step G4 and the CPU 32 calculates press force F on the basis of the input detection data D2. In this instance, the force detector means 55a to 55d detect the press force F of the finger 30a of the operator in the pushed position on the input detection surface to output an input detection signal S2 to the A/D driver 31. The A/D driver 31 A/D-converts the input detection signal S2, and transfers the A/D-converted input detection data D2 to the CPU 32.

The procedure then goes to a step G5, and the CPU 32 compares the press force F with the pushing judgment threshold Fth and judges whether or not the relationship: F>Fth is satisfied. When the relationship: F>Fth is satisfied, the procedure goes to a step G6 where the haptic stimulus "A" is started. The haptic stimulus "A" is obtained by vibrating the input detection surface by means of the piezoelectric actuators 25a and 25b in accordance with the vibration pattern Pa corresponding to the press force F of the finger 30a of the operator.

In the haptic stimulus "A", for example, with respect to the frequency fx, amplitude Ax, and number Nx shown in FIG. 14A, the input detection surface is vibrated with a vibration pattern of [fx Ax Nx]=[50 5 2] on the first stage i for about 0.1 second and vibrated with a vibration pattern of [fx Ax Nx]= [100 10 2] on the second stage ii for about 0.1 second. In this case, different vibration patterns can be generated according to the "press force" of the operator (driving requirement a).

The procedure then goes to a step G7 and the CPU 32 further detects press force F. The press force F is detected by the force detector means 55a to 55d when the operator is removed from the button icon 29a subsequent to pushing the button icon 29a. In this instance, the force detector means 55a to 55d detect press force F generated when the finger 30a of the operator is removed from the pushed position on the input detection surface to output the input detection signal S2 to the A/D driver 31. The A/D driver 31 A/D-converts the input detection signal S2, and transfers the A/D-converted input detection data D2 to the CPU 32.

The procedure then goes to a step G8, and the CPU 32 compares the press force F with the pushing judgment threshold Fth and judges whether or not the relationship: F<Fth is satisfied. When the relationship: F<Fth is satisfied, the haptic stimulus "B" is started. The haptic stimulus "B" is obtained by vibrating the input detection surface by means of the piezoelectric actuators 25*a* and 25*b* in accordance with the vibration pattern Pb corresponding to the press force F of the finger 30*a* of the operator. In the haptic stimulus "B" caused when the button icon 29*a* is released, for example, as shown in FIG. 14B, the input detection surface is vibrated with a vibration pattern of [fx Ax Nx]=[80 8 2] on the first stage i for about 0.1 second and vibrated with a vibration pattern of [fx Ax Nx]=[40 8 2] on the second stage ii for about 0.1 second. In this case, different vibration patterns can be generated in accordance with the "press force" of the operator (driving requirement b).

The procedure then goes to a step G10 where the input is settled. In this instance, the CPU 32 settles the input information displayed in the pushed position on the input operation surface. The procedure then goes to a step G12. When another processing mode is selected in the step G3, the procedure goes to a step G11 and another processing mode is executed. Another processing mode includes a telephone mode, a mail mode, and a transmission display mode. The telephone mode includes an operation of phoning someone. The button icon 29*a* or the like includes a character input item for selection of the telephone mode. After another processing mode is executed, the procedure goes to a step G12.

In the step G12, the CPU 32 decides whether to terminate the processing or not. For example, the CPU 32 detects power source OFF information to terminate the information processing. When the power source OFF information is not detected, the procedure goes back to the step G2, and an icon image, such as a menu, is displayed and the above-mentioned processing is repeated.

The mobile phone 400 having a haptic input function, provided with the input device 90, according to the fourth embodiment has the touch panel supporting vibrator 300 of the present invention, and can give a haptic stimulus in response to the input operation to the finger 30*a* of the operator from the rigid upper housing 20 having fixed the display means 29 and the touch panel 24.

Therefore, when the piezoelectric actuators 25*a*, 25*b* are vibrated, irrespective of the position of the upper housing 20 being used, high reliability with respect to the vibration transmission can be surely achieved. Not only in the mobile phone 400 but also particularly in an electronic device to which external force of vibration, impact, or the like is highly possibly exerted, such as another mobile device or a car device, the function of applying the vibration generated by the piezoelectric actuators 25*a*, 25B in the upper housing 29 or the like can be exhibited.

The present invention is advantageously applied to an information processing device, mobile phone, personal digital assistant, or the like which gives a haptic stimulus to an operating body when selecting an icon on the input display screen and inputting information.

The substrate supporting vibration structure according to the embodiment of the present invention has the piezoelectric element formed at a predetermined position between the first substrate and the second substrate or at a predetermined position of the long strip-form portion of the spacer member. The vibration supporting portion and vibration applying portion of the piezoelectric element are disposed in the thicknesswise direction of the first and second substrates stacked.

With this structure, it is possible to provide a vibration housing having fixed the first substrate and the second substrate and having rigidity that reduces a dimensional change caused due to bending stresses or torsion stresses. Therefore, when the piezoelectric element is vibrated, irrespective of the position of the vibration housing being used, high reliability with respect to the vibration transmission can be surely achieved.

The input device having a haptic function according to the embodiment of the present invention includes the substrate supporting vibration structure of the present invention, and can give a haptic stimulus to an operating body in response to the input operation from the rigid vibration housing having fixed the input detector means and the display means.

With this structure, when the piezoelectric element is vibrated, irrespective of the position of the vibration housing being used, high reliability with respect to the vibration transmission can be surely achieved. In particular, vibration caused by the piezoelectric element in the substrate supporting vibration structure can be applied to electronic devices, such as mobile devices or in-vehicle devices, which highly possibly receive vibration or impact as external force.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. A substrate supporting vibration structure which is a vibration structure for supporting a substrate, comprising:
   a spacer member, fixed between a first substrate and a second substrate, having at least one form selected from a pillar form and a long strip form; and
   a piezoelectric element, formed at a predetermined position between the first substrate and the second substrate or at a predetermined position of the long strip-form portion of the spacer member, having a vibration supporting portion and a vibration applying portion,
   wherein the vibration supporting portion and vibration applying portion of the piezoelectric element are disposed in the thicknesswise direction of the first and second substrates stacked, wherein:
   the spacer member having a long strip form has formed therein a part fitting site having an internal hollow form,
   the vibration supporting portion is joined to a bottom of the part fitting site, and
   the vibration applying portion is joined to a top of the part fitting site.

2. The substrate supporting vibration structure according to claim 1, wherein the piezoelectric element is a bimorph-type piezoelectric actuator.

3. A substrate supporting vibration structure which is a vibration structure for supporting a substrate, comprising:
   a spacer member, fixed between a first substrate and a second substrate, having at least one form selected from a pillar form and a long strip form; and
   a piezoelectric element, formed at a predetermined position between the first substrate and the second substrate or at a predetermined position of the long strip-form portion of the spacer member, having a vibration supporting portion and a vibration applying portion, wherein the vibration supporting portion and vibration applying portion of the piezoelectric element are disposed in the thicknesswise direction of the first and second substrates stacked, wherein:

the spacer member having a long strip form has formed therein a part fitting site having a top-open form, the vibration supporting portion is joined to the part fitting site, and the vibration applying portion is joined to the second substrate.

4. The substrate supporting vibration structure according to claim 3, wherein the piezoelectric element is a bimorph-type piezoelectric actuator.

* * * * *